United States Patent
Sasaki et al.

(10) Patent No.: US 8,724,734 B2
(45) Date of Patent: May 13, 2014

(54) CODING METHOD, DECODING METHOD, APPARATUSES THEREOF, PROGRAMS THEREOF, AND RECORDING MEDIUM

(75) Inventors: Shigeaki Sasaki, Tokyo (JP); Takeshi Mori, Tokyo (JP); Hitoshi Ohmuro, Tokyo (JP); Yusuke Hiwasaki, Tokyo (JP); Akitoshi Kataoka, Tokyo (JP); Kimitaka Tsutsumi, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 697 days.

(21) Appl. No.: 12/812,549

(22) PCT Filed: Jan. 23, 2009

(86) PCT No.: PCT/JP2009/051123
§ 371 (c)(1),
(2), (4) Date: Oct. 8, 2010

(87) PCT Pub. No.: WO2009/093714
PCT Pub. Date: Jul. 30, 2009

(65) Prior Publication Data
US 2011/0044405 A1    Feb. 24, 2011

(30) Foreign Application Priority Data
Jan. 24, 2008  (JP) ................................ 2008-013868

(51) Int. Cl.
*H04L 27/00* (2006.01)
(52) U.S. Cl.
USPC ............................ 375/295; 375/316; 375/296
(58) Field of Classification Search
USPC ......................................... 375/295, 296, 316
See application file for complete search history.

(56) References Cited

U.S. PATENT DOCUMENTS

| | | | |
|---|---|---|---|
| 5,684,920 A | * | 11/1997 | Iwakami et al. ............... 704/203 |
| 6,141,637 A | * | 10/2000 | Kondo ........................... 704/204 |
| 2005/0060147 A1 | * | 3/2005 | Norimatsu et al. ........... 704/230 |

FOREIGN PATENT DOCUMENTS

| | | |
|---|---|---|
| EP | 0 673 014 A2 A3 | 9/1995 |
| JP | 7 261800 | 10/1995 |
| JP | 11 177434 | 7/1999 |
| JP | 2001 298367 | 10/2001 |

OTHER PUBLICATIONS

Extended European Search Report issued Nov. 25, 2011 Patent Application No. 09 703 930.9.

(Continued)

*Primary Examiner* — Leila Malek
(74) *Attorney, Agent, or Firm* — Oblon, Spivak, McClelland, Maier & Neustadt, L.L.P.

(57) ABSTRACT

A coding method with a small error is provided. In the coding method of the present invention, a normalization value obtained from an input signal is corrected for an error calculated from an input and output in vector quantization and is then quantized. The coding method includes a normalization stage of normalizing the input signal in accordance with the normalization value of the input signal, calculated in each frame; a dividing stage of dividing the normalized frame into divided input signal sequences in accordance with a predetermined rule; a vector quantization stage of applying vector quantization to the divided input signal sequences to generate a vector quantization index; and a normalization value correction stage of correcting the normalization value of the input signal for the error obtained from the input and output in the vector quantization stage.

23 Claims, 28 Drawing Sheets

(56) References Cited

OTHER PUBLICATIONS

Andrzej Chmielewski, et al., "Real Time Implementation of Forward Gain-Adaptive Vector Quantizer", XP010077342, Jun. 13, 1988, pp. 40-43.

Michael J. Sabin, et al., "Product Code Vector Quantizers for Waveform and Voice Coding", IEEE Transactions on Acoustics, Speech, and Signal Processing, vol. ASSP-32, No. 3, XP002663480, Jun. 1984, pp. 474-488.

Wei, J. et al., "An Efficient Coding Scheme Based on Sub-Frame Vector Quantization", Proceedings of the 5$^{th}$ International Conference on Signal Processing, 2000 (WCCC-ICSP 2000), vol. 2, pp. 1073-1076 (Aug. 2000).

Mouchtaris, A. et al., "Conditional Vector Quantization for Voice Conversion", Proceedings of the IEEE International Conference on Acoustics, Speech and Signal Processing, 2007( ICASSP 2007), vol. 4, pp. IV-505-IV-508 (Apr. 2007).

Miki, S. et al., "Pitch Synchronous Innovation CELP (PSI-CELP)", TRANS.IEICE, vol. J77-A, No. 3, pp. 314-324 (Mar.,1994) (with partial English translation).

\* cited by examiner

CODING METHOD, DECODING METHOD, APPARATUSES THEREOF, PROGRAMS THEREOF, AND RECORDING MEDIUM

TECHNICAL FIELD

The present invention relates to a method of coding digital signals such as video signals and audio signals of speech and music, a decoding method, apparatuses therefor, programs therefor, and a recording medium.

BACKGROUND ART

In one conventionally known method of coding a speech signal, for example, with high efficiency, a sequence of samples of input original sound is divided into input signal sequences at regular intervals of about 5 to 50 ms, referred to as frames; a normalization value for the input signal sequence in each frame is obtained; the values of samples in the input signal sequence of each frame are normalized by the normalization value, and the resultant normalized input signal sequence is divided in accordance with a predetermined rule; and then vector quantization is performed.

A coding apparatus according to this coding method is shown in FIG. 27, and a decoding apparatus is shown in FIG. 28. The operation will be described briefly. The coding apparatus includes a normalization value generator 101, a normalizer 102, a divider 103, a vector quantizer 104, and a normalization value quantizer 105. The normalization value generator 101 receives an input signal sequence $X=\{X_n; n=0$ to $N-1\}$ that includes a plurality of samples of original sound in each frame, where N is the number of samples per frame. The input signal sequence X can be a sequence of samples in the time domain or a sequence of samples in a spectrum obtained by converting the sample sequence into the frequency domain in each frame. The normalization value generator 101 outputs a square root of a mean value of the powers of the samples in the input signal sequence X, as a normalization value G. The normalization value quantizer 105 quantizes the normalization value G obtained in the normalization value generator 101 and outputs a normalization value quantization index $I_G$. In the case where the normalizer 102 uses a decoded normalization value G' obtained by decoding the normalization value quantization index $I_G$, the normalization value quantizer 105 outputs a decoded normalization value G' as well.

The normalizer 102 receives the input signal sequence X and the normalization value G obtained by the normalization value generator 101 or the decoded normalization value G' obtained by the normalization value quantizer 105, normalizes the input signal sequence by dividing each sample value (amplitude value) in the input signal sequence X by the normalization value G or the decoded normalization value G' or by multiplying the sample value by the reciprocal of the normalization value G or the reciprocal of the decoded normalization value G', and outputs a normalized input signal sequence $x=\{x_n; n=0$ to $N-1\}$. The divider 103 divides the normalized input signal sequence x output from the normalizer 102 to M divided input signal sequences $u_i$ (i=0 to M−1, where M is an integer greater than or equal to 1), in accordance with a predetermined rule, and outputs them. When M=1, no division is made, and $x=u_0$, so that the divider 103 may be omitted.

The vector quantizer 104 performs vector quantization of each of the divided input signal sequences output from the divider 103 and outputs a vector quantization index $k_i$. The vector quantizer 104 has a vector codebook 104T which associates a finite number of, for example, two or more, indexes with predetermined representative vector values, respectively. The vector quantizer 104 outputs an index $k_i$ corresponding to a representative vector value having the smallest distance measure to a given divided input signal sequence $u_i$, as a vector quantization index.

The decoding apparatus includes a vector decoder 111, a reconstructing unit 112, a normalization value decoding unit 113, and an inverse normalizer 114. Like the vector quantizer 104 in the coding apparatus, the vector decoder 111 has a vector codebook 111T, decodes each vector quantization index $k_i$ given from the coding apparatus by reading out a representative vector value corresponding to $k_i$ from the vector codebook 111T, and outputs a divided output signal sequence $v_i$. The reconstructing unit 112 reconstructs a normalized output signal sequence y by using the divided output signal sequence $v_i$ of a single frame given from the vector decoder 111, in accordance with a predetermined rule that equalizes the relationship between x and $u_i$ in the divider 103 of the coding apparatus and the relationship between y and $v_i$. The normalization value decoding unit 113 decodes the normalization value quantization index $I_G$ sent from the coding apparatus and outputs a decoded normalization value G'. The inverse normalizer 114 receives the reconstructed normalization value output signal sequence y and the decoded normalization value G', performs inverse normalization by multiplying the output signal sequence y by the decoded normalization value G', and outputs an output signal sequence Y.

In the conventional coding method implemented by the coding apparatus and the decoding apparatus described above, variation in amplitude value among different input signal sequences of different frames can be reduced by normalizing the input signal beforehand in each frame, so that the efficiency of vector quantization can be improved. According to Patent literature 1, the frequency-domain signal of each frame is normalized, and the result is subjected to vector quantization.

Non-patent literature 1 indicates that, in CELP coding, each frame of the time-domain input signal is divided into subframes, and vector quantization is conducted on the powers of a series of the subframes.

Patent literature 1: Japanese Patent Application Laid Open No. H07-261800 (paragraphs [0016] to [0021])

Non-patent literature 1: Toshio Miki, et al., "Pitch Synchronous Innovation CELP (PSI-CELP)," the IEICE Transactions, Vol. J77-A, No. 3, pp. 314-324, March, 1994

DISCLOSURE OF THE INVENTION

Problems to be Solved by the Invention

In the conventional method described above, however, the normalization value is obtained by the normalization value generator 101 on the basis of the input signal alone. Even if the decoding apparatus uses the vector quantization index obtained by performing vector quantization of the divided input signal sequences obtained by dividing the normalized input signal sequence and the normalization value obtained from the input signal alone, it would not necessarily be possible to produce, through decoding, an output signal with a smaller error, that is, with an improved signal to noise ratio (SNR), representing the amount of error between the input signal of the coding apparatus and the output signal of the decoding apparatus. Coding with a small error is thus not guaranteed.

In view of the problem described above, it is an object of the present invention to provide a coding method with a small error, a decoding method, apparatuses therefor, programs therefor, and a recording medium.

Means to Solve the Problems

A coding method according to a first aspect of the present invention includes a normalization step of normalizing an input signal in each frame containing a plurality of samples, with a normalization value corresponding to the input signal and calculated from the input signal in the frame to generate a normalized input signal sequence; a signal quantization step of quantizing the normalized input signal sequence to generate a signal quantization index; a correction coefficient generation step of generating a correction coefficient that minimizes a distance measure between an input signal sequence and a signal sequence obtained by inverse normalizing a signal sequence corresponding to the signal quantization index with the normalization value corrected with the correction coefficient; a normalization information quantization step of generating a normalization information quantization index by quantizing the correction coefficient and the normalization value or the normalization value corrected with the correction coefficient; and a code output step of outputting a code that includes at least the signal quantization index and the normalization information quantization index.

A coding method according to a second aspect of the present invention includes a normalization step of normalizing an input signal in each frame containing a plurality of samples, with a normalization value corresponding to the input signal and calculated from the input signal in the frame to generate a normalized input signal sequence; a dividing step of generating a divided input signal sequence by dividing the normalized input signal sequence in accordance with a predetermined rule in each frame; a vector quantization step of performing vector quantization of the divided input signal sequence to generate a vector quantization index; a decoding step of generating a signal sequence corresponding to the vector quantization index as a divided output signal sequence; a correction coefficient generation step of generating a correction coefficient by dividing a first correction coefficient by a second correction coefficient, the first correction coefficient being the sum of the inner products of the divided input signal sequence and the divided output signal sequence and the second correction coefficient being the sum of the sums of squares of the vectors of the divided output signal sequence; a normalization information quantization step of generating a normalization information quantization index by quantizing the correction coefficient and the normalization value or the normalization value corrected with the correction coefficient; and a code output step of outputting a code that includes at least the vector quantization index and the normalization information quantization index.

A decoding method according to the present invention includes a normalization value decoding process of decoding an input normalization value quantization index to generate a normalization value of each frame; a vector decoding process of decoding an input signal quantization index to generate a normalized output signal sequence of each frame; a correction coefficient decoding process of decoding an input correction coefficient quantization index to generate a correction coefficient of each frame; a normalization value correction process of correcting the normalization value with the correction coefficient to generate a corrected normalization value; and an inverse normalization process of inverse normalizing the normalized output signal sequence with the corrected normalization value to generate an output signal of each frame.

Effects of the Invention

According to a coding method, a decoding method, and apparatuses therefor of the present invention, a normalization value obtained from an input signal in each frame is corrected such that a coding error calculated from an input and output used when a vector quantization index is generated in coding is minimized, thereby implementing coding and decoding with a small error, that is, with an improved SNR.

BEST MODES FOR CARRYING OUT THE INVENTION

Figure 1:
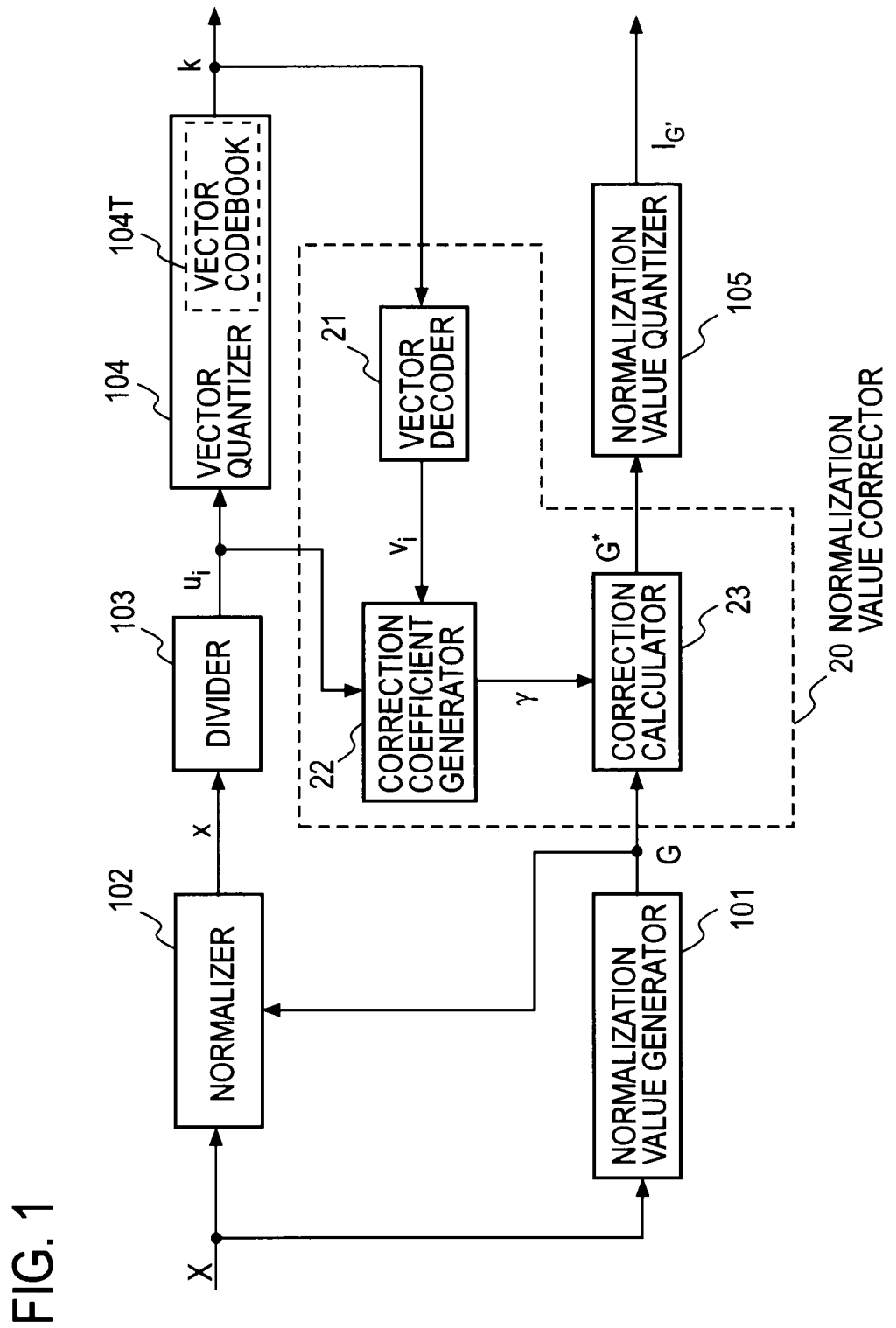
FIG. 1 shows an example of a functional structure of a coding apparatus according to a first embodiment of the present invention.

Embodiments of the present invention will be described below with reference to the drawings. Like elements in a plurality of drawings are indicated by like reference characters, and a description of those elements will not be repeated.

Basic Concept of Present Invention

Prior to the description of the embodiments, a description of the basic concept of a coding method according to the present invention will be given. The normalization value G generated by the above-described normalization value generator 101 is defined by equation (1), for example.

$$G = \sqrt{\|X\|^2/N} \quad (1)$$

$X = \{X_n; n=0 \text{ to } N-1\}$

Here, X is a sequence of samples $X_0$ to $X_{N-1}$ of the input signal in each frame, and N is the number of samples per frame. The normalization value G defined by equation (1) is the square root of a mean value of a power of the input signal in each frame. For the purpose of simplifying the explanation, an example without a dividing stage will now be described. Let a normalized input signal sequence obtained by normalization after division by the normalization value G be $x=\{x_n; n=0 \text{ to } N-1\}$, and a normalized output signal sequence after decoding by the decoding apparatus be $y=\{y_n; n=0 \text{ to } N-1\}$.

An error d representing a distance measure between the input signal sequence X=Gx before normalization in each frame and an output signal sequence Y=Gy after inverse normalization in the decoding apparatus is given by equation (2).

$$d = \|Gx - Gy\|^2 = G^2(\|x\|^2 - 2x^t y + \|y\|^2) \quad (2)$$

Here, t means transposition.

The basis of the coding method of the present invention is as follows: The normalization value G to be given to the decoding apparatus is corrected by a correction coefficient γ to minimize the error d and the corrected normalization value G*=γG is given to the decoding apparatus, or the normalized output signal sequence y is multiplied by the correction coefficient γ, so that an output signal sequence with a minimized error is obtained. Accordingly, the error d' representing the distance measure between the input signal sequence of the coding apparatus and the output signal sequence of the decoding apparatus in each frame, according to the coding method of the present invention can be given by the following equation (3).

$$d' = \|Gx - G^* y\|^2 Gx - \gamma Gy\|^2 = G^2(\|x\|^2 - 2\gamma x^t y + \gamma^2 \|y\|^2) \quad (3)$$

The coefficient γ that minimizes the error d' can be determined by obtaining γ that satisfies the following equation (4).

$$\frac{\partial d'}{\partial \gamma} = -G^2(2x^t y - 2\gamma \|y\|^2) = 0 \quad (4)$$

Except for G=0, γ can be expressed by the following equation (5).

$$\gamma = \frac{x^t y}{\|y\|^2} \quad (5)$$

By substituting γ given by equation (5) into equation (3), the error d' according to the present invention can be transformed as given by the following equation (6).

$$d' = G^2 \left( \|x\|^2 - \frac{(x^t y)^2}{\|y\|^2} \right) \quad (6)$$

For the purpose of comparing the magnitudes of the coding error d by the conventional method and the coding error d' by the present invention, the difference between them is calculated as given by the following equation (7).

$$\begin{aligned} d - d' &= G^2(\|x\|^2 - 2x^t y + \|y\|^2) - G^2\left(\|x\|^2 - \frac{(x^t y)^2}{\|y\|^2}\right) \\ &= \frac{G^2}{\|y\|^2}\left[(\|y\|^2)^2 - 2(x^t y)\|y\|^2 + (x^t y)^2\right] \\ &= \frac{G^2}{\|y\|^2}(\|y\|^2 - (x^t y))^2 \end{aligned} \quad (7)$$

Equation (7) always satisfies d—d'≥0, except for y=0. In other words, the coding error d' by the present invention is smaller than or equal to the coding error d by the conventional method. Therefore, coding and decoding with a smaller error, that is, with an improved SNR, can be implemented by performing coding and decoding by taking the corrected normalization value G* into consideration.

First Embodiment

Figure 2:
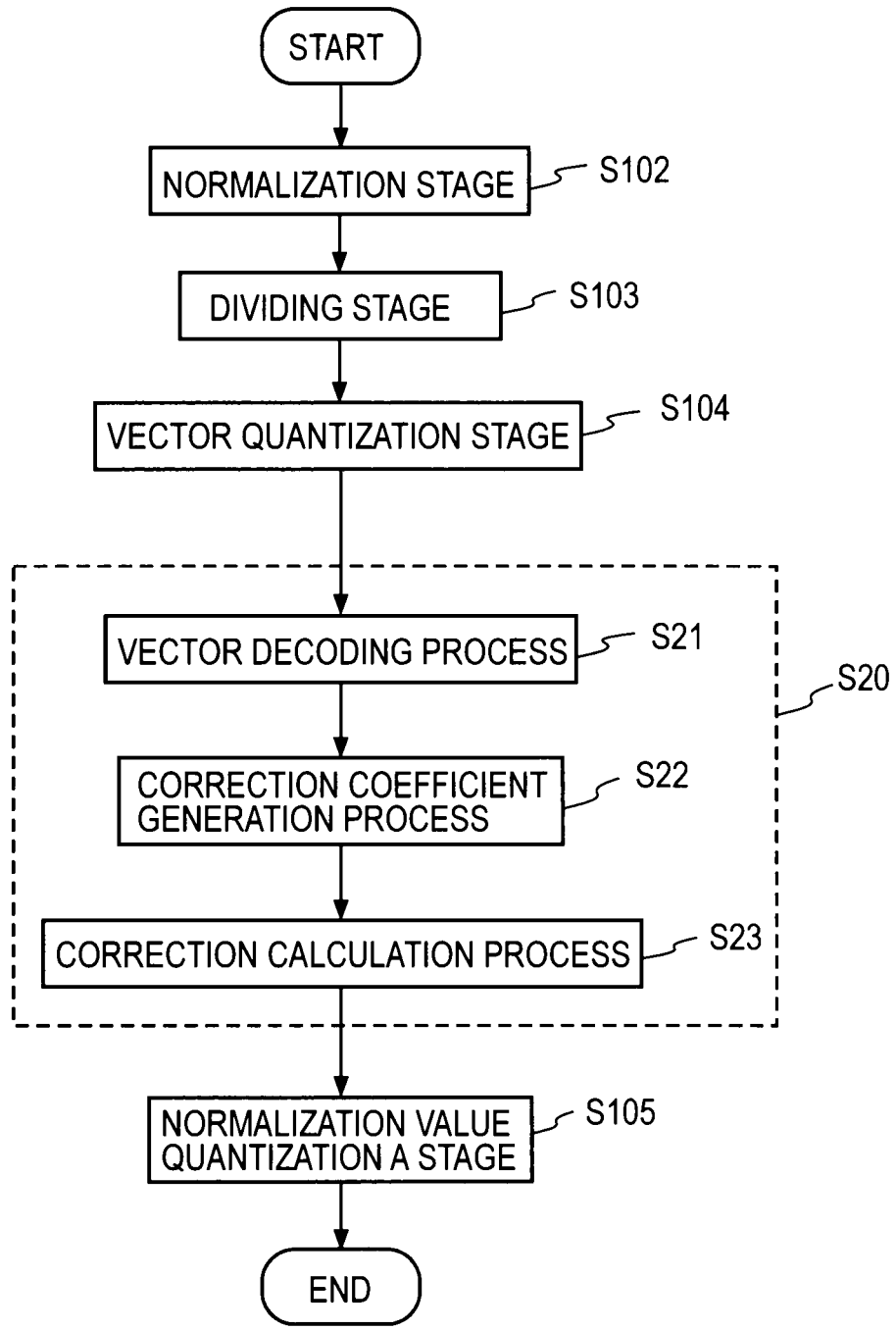
FIG. 2 shows an operation flow of the coding apparatus shown in FIG. 1.
Figure 27:
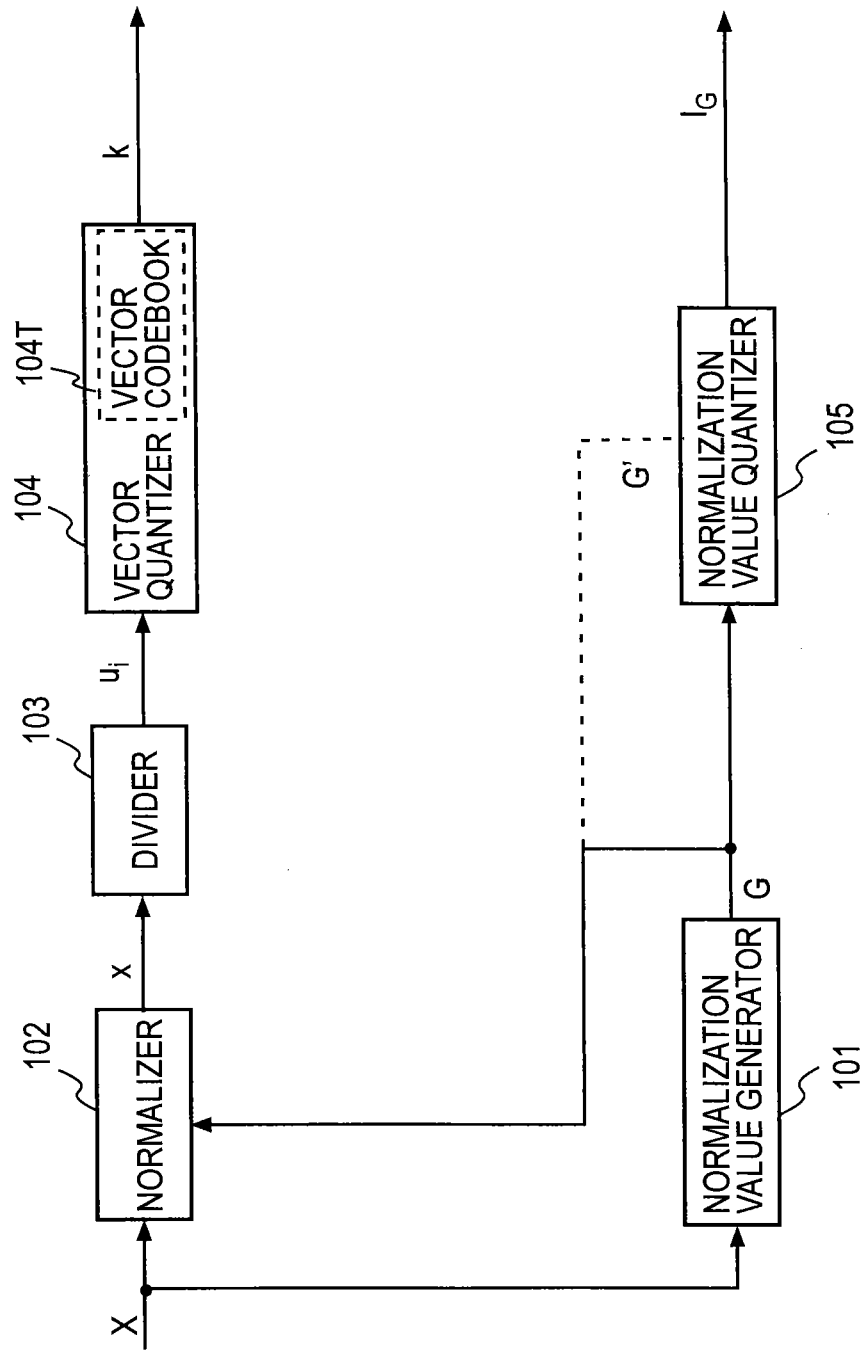
FIG. 27 shows an example of a functional structure of a conventional coding apparatus.

FIG. 1 shows a functional structure of a coding apparatus 10 of a first embodiment, using the coding method according to the present invention, and FIG. 2 shows its operation flow. The elements of the apparatus operate on each frame containing a plurality of samples. The input signal in each frame can be a signal in the time domain or a signal in the frequency domain. An example described below uses a signal in the frequency domain as the input signal. The coding apparatus 10 includes a normalization value generator 101, a normalizer 102, a divider 103, a vector quantizer 104, a normalization value quantizer 105, and a normalization value corrector 20. The structure of the coding apparatus differs from the structure of the conventional coding apparatus shown in FIG. 27 in that the normalization value corrector 20 is added. The elements indicated by the same reference characters as in FIG. 27 operate in the same way as those shown in FIG. 27. The coding apparatus of this embodiment can also be implemented by a computer that includes a ROM, a RAM, a CPU, and the like, for example, when a predetermined program is read into the computer and executed by the CPU.

The normalization value generator 101 outputs, as a normalization value G, a square root of a mean value of powers of the samples of the input signal in the input signal sequence X. The normalization value G can also be a mean value of absolute values, instead of the square root of the mean value of the powers, of the samples of each input signal. The normalization value can also be a standard deviation of the input signal per frame.

The normalizer 102 outputs a normalized input signal sequence x={$x_n$; n=0 to N−1} obtained by dividing each sample of the input signal sequence X by the normalization value G (step S102). The divider 103 divides the normalized input signal sequence x and outputs divided input signal sequences $u_i$={$u_{i,j}$; i=0 to M−1; j=0 to h(i)}, where h(i) is the number of samples in the i-th divided input signal sequence (step S103). In this example, the normalized input signal sequence x is a signal in the frequency domain, and it is assumed that the normalized input signal sequence x of a single frame includes 16 sample spectrum components $x_0$ to $x_{15}$ arranged in ascending order of frequency. In this case, by expressing the sequence as $x_n = x_{i+jM}$, the divider 103 divides the normalized input signal sequence $x_n$ (n=0 to N−1) as given by the following equation (8).

$$u_{i,j}=x_{i+jM}, i=0,\ldots,M-1; j=0,\ldots,h(i)-1 \quad (8)$$

Figure 3:
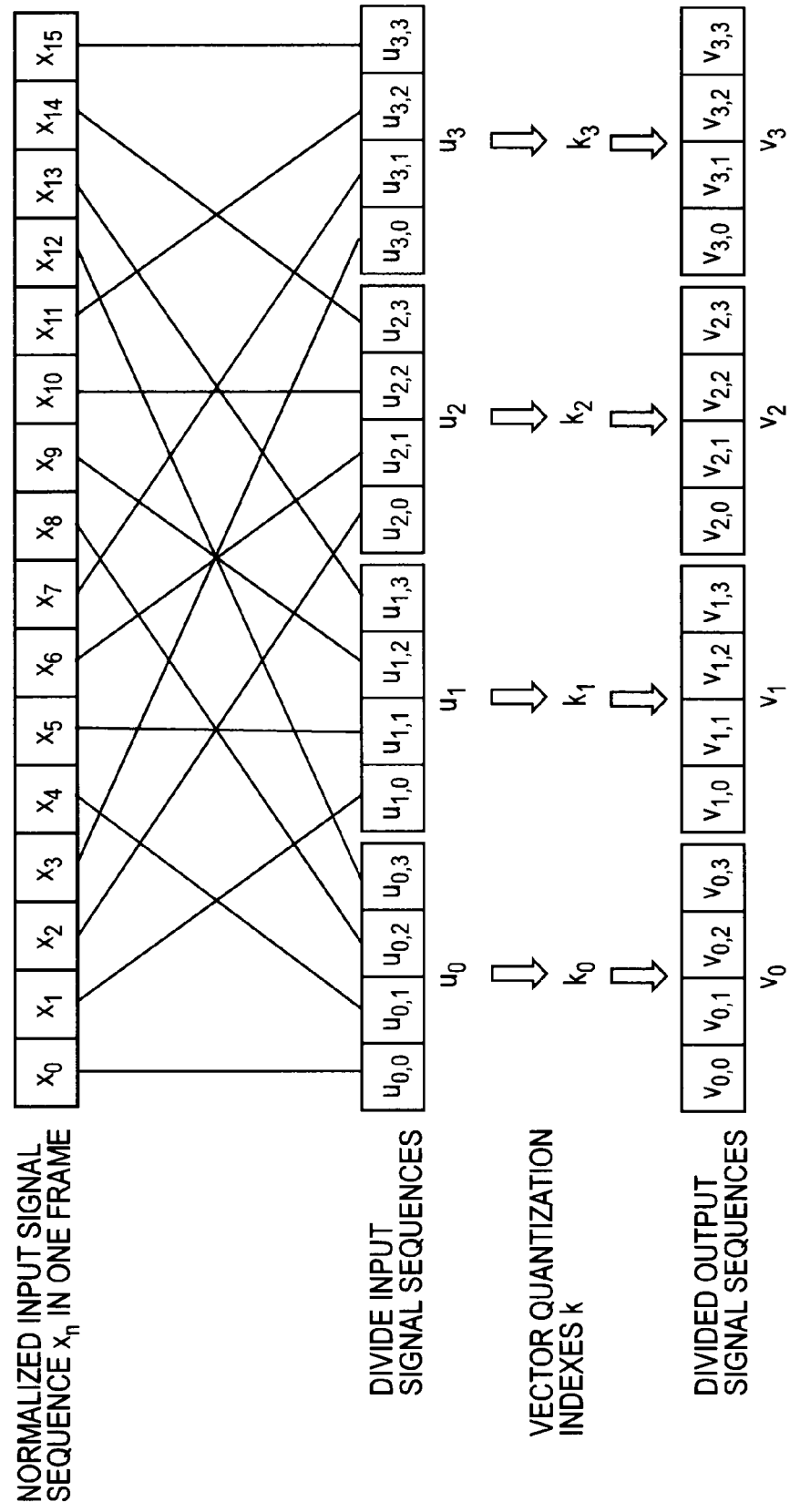
FIG. 3 shows an example of an operation of a divider 103 shown in FIG. 1.

The number of samples in the i-th divided input signal sequence $u_i$ is expressed by h(i). In this example, division is made to give the same number of samples in each divided input signal sequence, which means that h(i)=N/M. FIG. 3 shows a normalized input signal sequence x in a single frame and divided input signal sequences $u_i$ when the division count M is 4. The normalized input signal sequence x of a single frame of a sixteen-component frequency spectrum is rearranged to four divided input signal sequences at intervals of four spectrum components. In a first division, where i=0, spectrum components $x_0$, $x_4$, $x_8$, and $x_{12}$ selected at intervals of four frequency components in ascending order of frequency from the normalized input signal sequence x form a single divided input signal sequence. For a second divided input signal sequence, where i=1, spectrum components $x_1$, $x_5$, $x_9$, and $x_{13}$ are selected.

The vector quantizer 104 has a vector codebook 104T which associates a finite number of, for example, two or more, indexes with predetermined representative vectors, and outputs, as a vector quantization index, an index $k_i$ corresponding to a representative vector that minimizes the distance measure from each divided input signal sequence $u_i$, which is the input vector to be quantized. More specifically, let the error $d_i$ expressed by the distance measure between samples $u_{i,j}$ of the divided input signal sequence $u_i$ and samples $w_{i,j}$ of the representative vector $w_i$ be given by the following equation.

$$d_i = \sum_{j=0}^{h(i)-1} (u_{i,j} - w_{i,j})^2 \quad (9)$$

The vector quantization index $k_i$ associated with $w_i$ that minimizes the error $d_i$ given by the equation can be obtained, and the representative vector $w_i$ corresponding to $k_i$ becomes the divided output signal sequence $v_i$. In the example shown in FIG. 3, the divided input signal sequence $u_i$ is a vector having four samples $u_{i,j}$ (j=0 to 3) as its elements and is quantized with reference to the vector codebook 104T, and a vector quantization index $k_i$ is output (step S104). Accordingly, in this example, four vector quantization indexes $k_0$, $k_1$, $k_2$, and $k_3$ are output in each frame. Although vector quantization has been explained as an example, signal quantization for generating indexes that give divided output signal sequences $v_i$ in association with the divided input signal sequences $u_i$ need not be vector quantization. For example, scalar quantization of the samples of the divided input signal sequences $u_i$ may be performed to output corresponding indexes. The vector quantizer 104 can be called a signal quantizer in a general sense.

The normalization value corrector 20 receives the divided input signal sequence $u_i$ output from the divider 103 and the vector quantization index $k_i$ output from the vector quantizer 104 and corrects the normalization value G to minimize the error (step S20). The correction coefficient γ that is used to correct the normalization value G is generated on the basis of the idea given by equation (5), that minimizes the difference between all the divided input signal sequences $u_i$ in the frame multiplied by the normalization value G and all the divided output signal sequences $v_i$, which are obtained by decoding the vector quantization indexes $k_i$, multiplied by the corrected normalization value G*. The normalization value G output from the normalization value generator 101 is corrected by the correction coefficient γ and then output. The normalization value quantizer 105 quantizes the corrected normalization value G* and outputs it as a normalized quantization index $I_{G'}$ (step S105).

The coding apparatus 10 described above can perform coding with a small coding error because the normalization value G is corrected by the normalization value corrector 20 to minimize the difference between the divided output signal sequences $v_i$, corresponding to the vector quantization indexes $k_i$, multiplied by the corrected normalization value G*, and the divided input signal sequences $u_i$ multiplied by the normalization value G.

The normalization value corrector 20 will be described in detail. The normalization value corrector 20 includes a vector decoder 21, a correction coefficient generator 22, and a correction calculator 23.

The vector decoder 21 has a vector codebook 111T, which is the same as the vector codebook 104T in the coding apparatus 10, decodes the vector quantization index $k_i$ with reference to the vector codebook 111T, and outputs the divided output signal sequence (representative vector) $v_i$. As shown in FIG. 3, four vector quantization indexes $k_0$ to $k_3$ are decoded to generate divided output signal sequences $v_0$ to $v_3$ corresponding to the four divided input signal sequences $u_0$ to $u_3$.

The correction coefficient generator 22 receives the divided input signal sequence $u_i$ and the divided output signal sequence $v_i$ and calculates a normalization value correction coefficient γ as given by equation (10) (step S22).

$$\gamma = \frac{\sum_{i=0}^{M-1} \sum_{j=0}^{h(i)-1} u_{i,j} v_{i,j}}{\sum_{i=0}^{M-1} \sum_{j=0}^{h(i)-1} v_{i,j}^2} \quad (10)$$

Here, $u_{i,j}$ represents each sample $\{u_{i,j}; i=0 \text{ to } M-1; j=0 \text{ to } h(i)-1\}$ of the divided input signal sequence $u_i$, and $v_{i,j}$ represents each sample $\{v_{i,j}; i=0 \text{ to } M-1; j=0 \text{ to } h(i)-1\}$ of the divided output signal sequence $v_i$. The subscript i represents the divided signal sequence number; M represents the division count; the subscript j represents the sample number in the divided signal sequence; and h(i) represents the number of samples included in the i-th divided signal sequence.

Equation (10) has the same meaning as equation (5), which gives a normalization value correction coefficient that minimizes the error d between the input signal sequence X=Gx and the output signal sequence Y=Gy in each frame.

The correction calculator 23 corrects the normalization value G to the corrected normalization value G*, which is obtained by multiplying the normalization value G output from the normalization value generator 101 by the normalization value correction coefficient γ output from the correction coefficient generator 22 (step S23). The normalization value quantizer 105 quantizes the corrected normalization value G* and outputs it as a normalization value quantization index $I_{G'}$ to the decoding apparatus, not shown in the figure, together with M vector quantization indexes $k_i$ (i=0 to M-1).

The coding apparatus of the present invention calculates the normalization value correction coefficient γ that minimizes the distance measure between an input signal to be coded and a decoded output signal, as expressed by equation (10), based on a signal corresponding to the normalized input signal, that is, in this embodiment, the divided input signal sequence $u_i$, and a signal corresponding to vector quantization, that is, in this embodiment, the divided output signal sequence $v_i$ obtained by decoding the result of vector quantization. The normalization value G is corrected by the normalization value correction coefficient γ, the corrected normalization value G* is quantized, and the quantization index $I_{G'}$ is output together with the vector quantization index $k_i$; or the non-corrected normalization value G and the correction coefficient γ are quantized separately, and the respective quantization indexes $I_{G'}$ and $I_\gamma$ are output together with the vector quantization index $k_i$, as in an embodiment described later. Accordingly, coding with an error smaller than before becomes possible.

Figure 28:
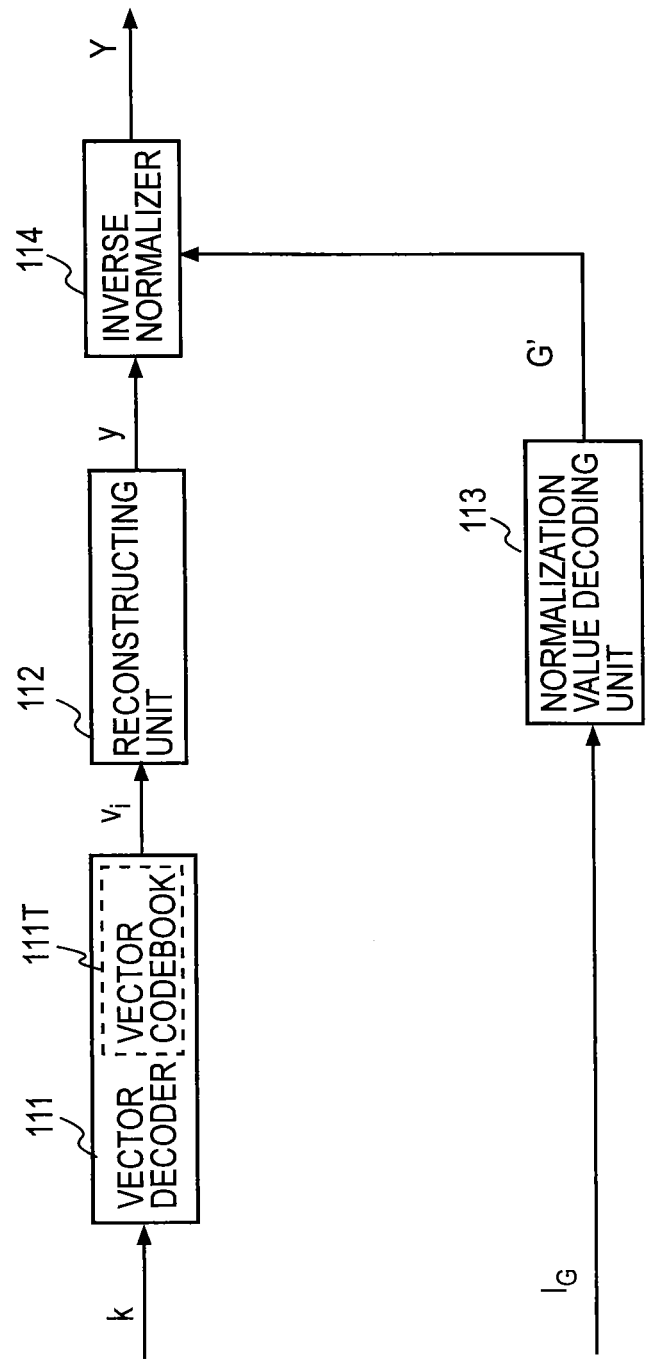
FIG. 28 shows an example of a functional structure of a conventional decoding apparatus.

The decoding apparatus corresponding to the coding apparatus in FIG. 1 can have the same structure as the conventional decoding apparatus 110 shown in FIG. 28. The normalization value decoding unit 113 decodes a corrected normalization value quantization index $I_{G'}$ to obtain the corrected normalization value G* and use it instead of the decoded normalization value G' corresponding to the non-corrected normalization value G in the conventional method, so that the decoding apparatus 110 can perform decoding with a high SNR.

According to the first embodiment, the correction coefficient generator 22 obtains the normalization value correction coefficient γ from the divided input signal sequence $u_i$ and its decoded divided output signal sequence $v_i$, so that it is not necessary to reconstruct the divided input signal sequence to the signal sequence before division. Therefore, the amount of calculation can be reduced in comparison with the method that includes reconstructing.

Second Embodiment

The vector quantizer 104 in the coding apparatus 10 shown in FIG. 1 will now be considered with reference to the following equation (11), obtained by expanding equation (9).

$$d_i = \sum_{j=0}^{h(i)-1} u_{i,j}^2 - 2\sum_{j=0}^{h(i)-1} u_{i,j} w_{i,j} + \sum_{j=0}^{h(i)-1} w_{i,j}^2 \tag{11}$$

The sum of squares of $w_{i,j}$ (the sum of squares of the vector) in the third term on the right side is independent of the divided input signal sequence $u_i$. Therefore, the sum of squares of all the elements of each of all the representative vectors stored in the vector codebook 104T can be calculated in advance and held in the vector codebook 104T. The sum of squares of the divided input signal sequence $u_i$ in the first term is a given fixed value. Therefore, when the vector quantizer 104 searches for a representative vector $w_i$ that minimizes the error $d_i$ corresponding to the divided input signal sequence $u_i$, it should find, with reference to equation (11), a representative vector $w_i$ that minimizes the sum of the second term representing the inner product of the vectors and the third term representing the sum of squares of the vector. The second term (excluding coefficient −2) and the third term used when the vector $w_i$ that minimizes the error $d_i$ is determined as the divided output signal sequence $v_i$ are stored as the values of the following equations.

$$P_i = \sum_{j=0}^{h(i)-1} u_{i,j} v_{i,j} \tag{12a}$$

$$Q_i = \sum_{j=0}^{h(i)-1} v_{i,j}^2 \tag{12b}$$

If the stored values are used in the calculation of the correction coefficient γ according to equation (10), the vector decoder 21 shown in FIG. 1 becomes unnecessary, and the amount of calculation can be reduced accordingly.

Figure 4:
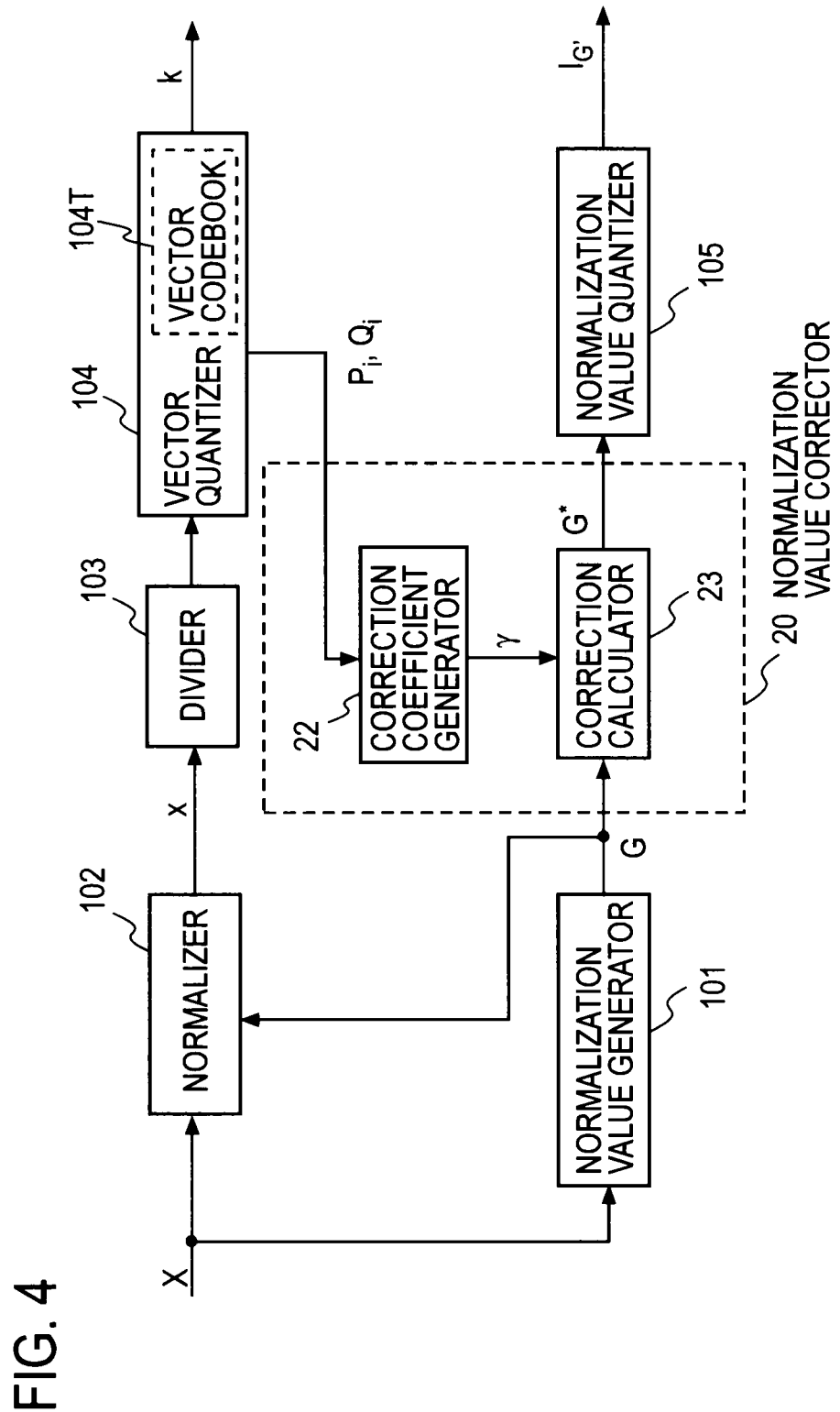
FIG. 4 shows an example of a functional structure of a coding apparatus according to a second embodiment of the present invention.
Figure 5:
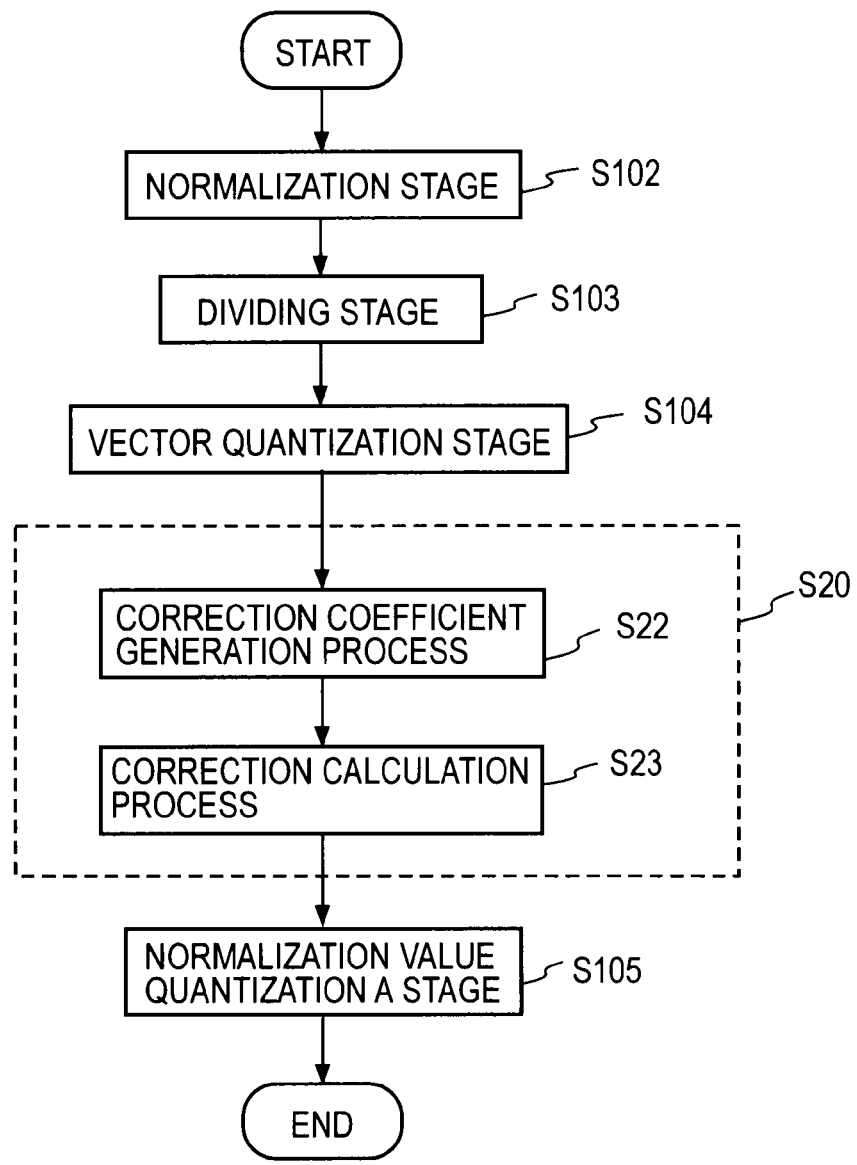
FIG. 5 shows an operation flow of the coding apparatus shown in FIG. 4.

A second embodiment is based on the idea described above. FIG. 4 shows a functional structure of a coding apparatus of the second embodiment, and FIG. 5 shows an operation flow. The structure of this embodiment differs from that of the embodiment shown in FIG. 1 in that the vector decoder 21 has been removed; the vector quantizer 104 provides the correction coefficient generator 22 with the second term and the third term of equation (11) used when the vector quantization index $k_i$ is determined, as M values of $P_i$ given by equation (12a) and M values of $Q_i$ given by equation (12b), respectively; and the correction coefficient generator 22 calculates the correction coefficient γ, as given by the following equation.

$$\gamma = \frac{\sum_{i=0}^{M-1} P_i}{\sum_{i=0}^{M-1} Q_i} \tag{13}$$

The rest of the operation is the same as in FIG. 1, and a description will be omitted.

The operation flow shown in FIG. 5 differs from the flow shown in FIG. 2 in that the vector decoding process S21 has been removed from the normalization value correction step S20; the second term and third term of equation (11) used when the vector quantization index of the divided input signal sequence $u_i$ is determined in the vector quantization stage S104 are held as $P_i$ and $Q_i$ (i=0 to M−1); and the correction coefficient γ is calculated as given by equation (13), instead of equation (10), in the correction coefficient generation process S22. The rest of the operation is the same as in FIG. 2.

The structure in which a correction coefficient is generated without performing vector decoding, described in the second embodiment, can be applied to embodiments described later. The conventional decoding apparatus shown in FIG. 28 can be used directly as a decoding apparatus corresponding to the coding apparatus shown in FIG. 4.

Third Embodiment

Figure 6:
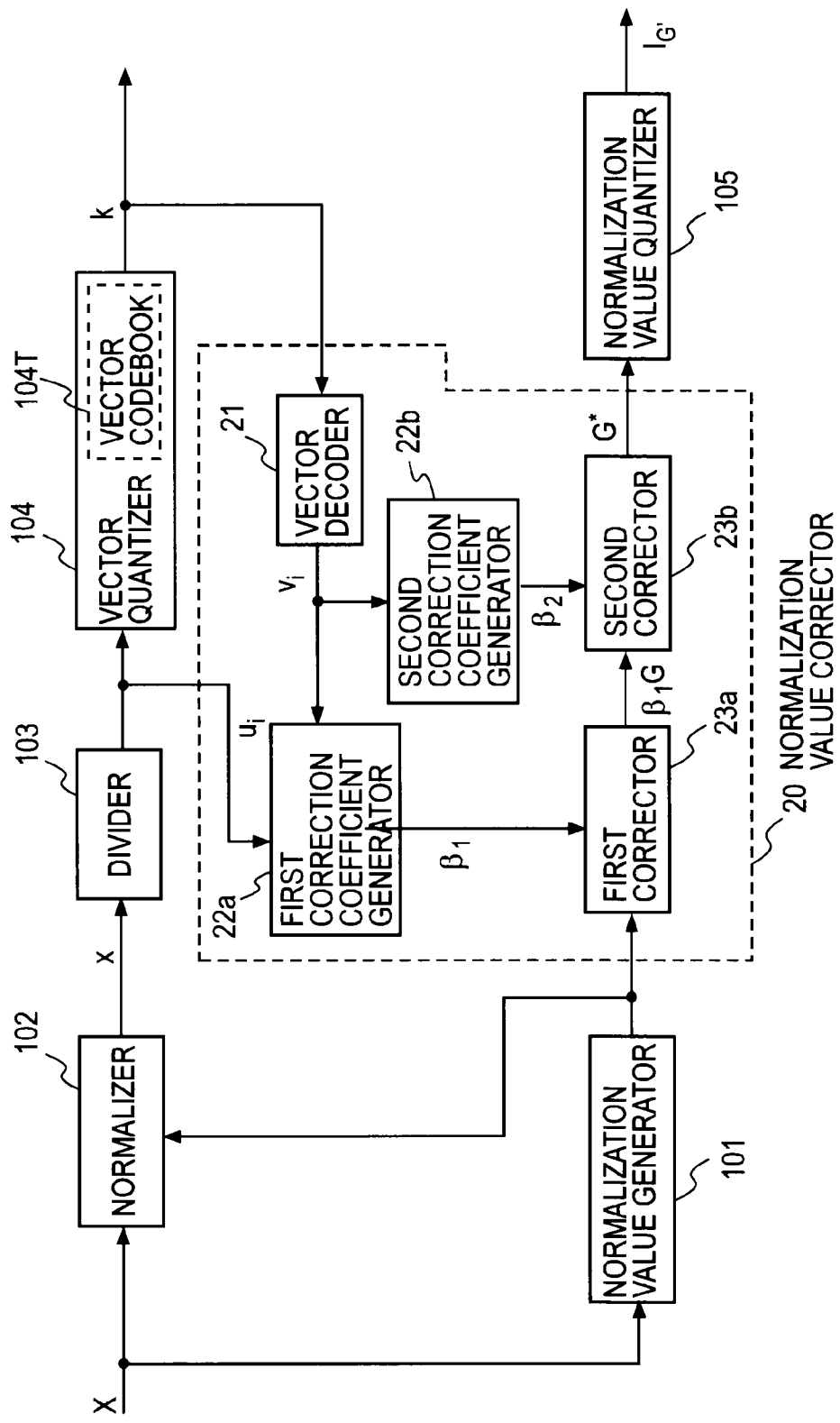
FIG. 6 shows an example of a functional structure of a coding apparatus according to a third embodiment of the present invention.
Figure 7:
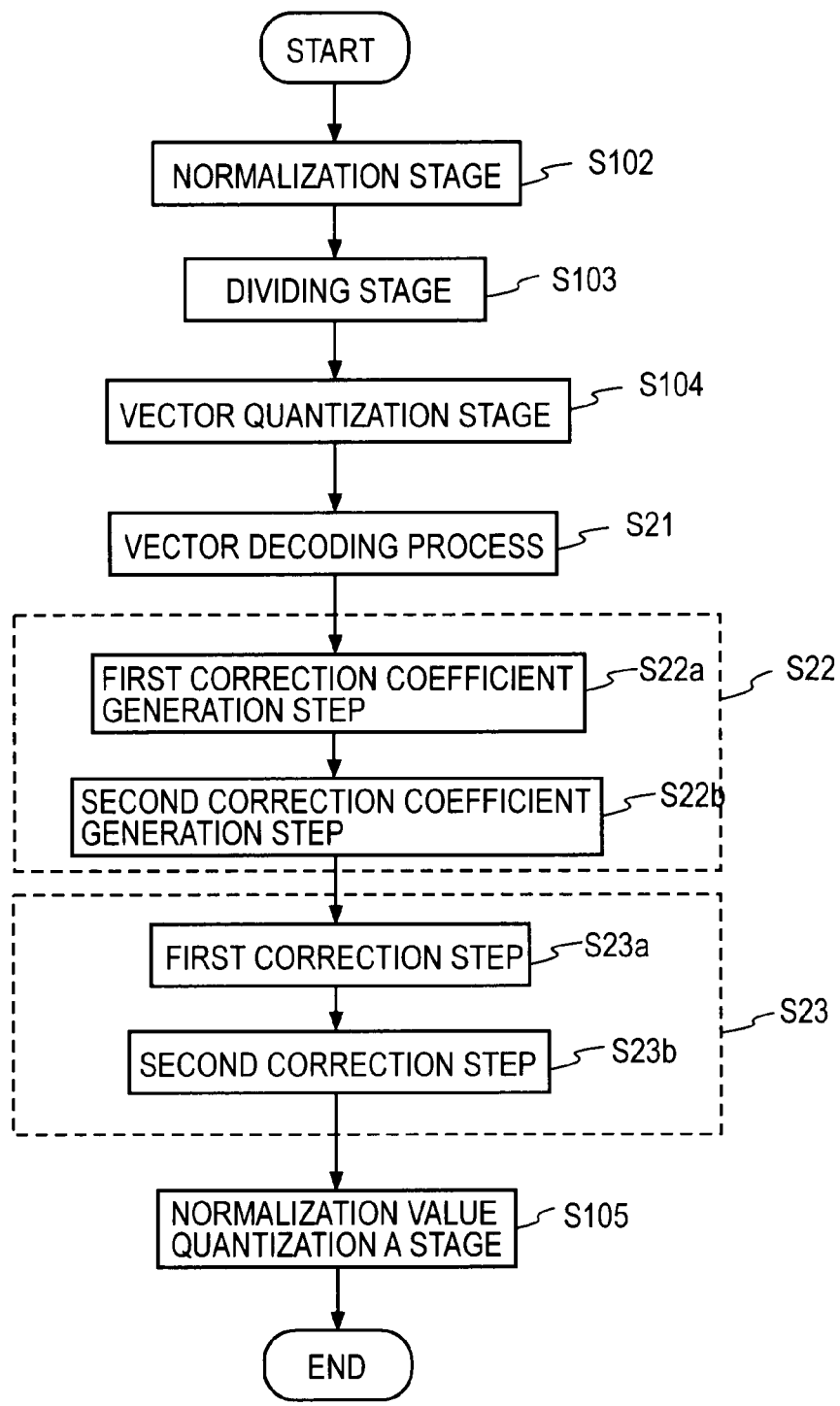
FIG. 7 shows an operation flow of the coding apparatus shown in FIG. 6.

FIG. 6 shows a functional structure of a coding apparatus of a third embodiment, utilizing the coding method according to the present invention, and FIG. 7 shows its operation flow. In this embodiment, a first correction coefficient generator 22a and a second correction coefficient generator 22b are provided instead of the correction coefficient generator 22 in the first embodiment shown in FIG. 1. In the third embodiment, a first corrector 23a and a second corrector 23b are provided instead of the correction calculator 23 in the first embodiment shown in FIG. 1. The other elements are the same as those in the coding apparatus shown in FIG. 1.

The first correction coefficient generator 22a receives the divided input signal sequence $u_i$ output from the divider 103 and the divided output signal sequence $v_i$ output from the vector decoder 21, and generates a sum of the inner products thereof for i=0 to M−1, as a first correction coefficient $\beta_1$, as given by equation (14) (step S22a).

$$\beta_1 = \sum_{i=0}^{M-1} \sum_{j=0}^{h(i)-1} u_{i,j} v_{i,j} \quad (14)$$

Equation (14) is the same as the numerator of equation (10).

The second correction coefficient generator 22B receives the divided output signal sequence $v_i$ output from the vector decoder 21, and generates, as a second correction coefficient $\beta_2$, a total sum of the sums of squares of all the samples in the divided output signal sequence $v_i$ for i=0 to M−1 as given by equation (15) (step S22b).

$$\beta_2 = \sum_{i=0}^{M-1} \sum_{j=0}^{h(i)-1} v_{i,j}^2 \quad (15)$$

Equation (15) is the same as the denominator of equation (10).

The first corrector 23a multiplies the normalization value G, which has been obtained from the input signal and outputted from the normalization value generator 101, by the first correction coefficient $\beta_1$ and outputs $\beta_1 G$ (step S23a). The second corrector 23b divides the normalization value $\beta_1 G$, which has been obtained by multiplying the first correction coefficient in the first corrector 23a, by the second correction coefficient $\beta_2$ and outputs the result as a corrected normalization value G* (step S23b). The second corrector 23b may divide the normalization value G by the second correction coefficient $\beta_2$, and then the first corrector 23a may multiply the result by the first correction coefficient $\beta_1$. That is, the order in which steps S23a and S23b are carried out may be inverted.

The coding apparatus structured as shown in FIG. 6 can perform coding with a high SNR in the same way as the coding apparatuses shown in FIGS. 1 and 4. The conventional decoding apparatus shown in FIG. 28 can be used directly as a decoding apparatus corresponding to the coding apparatus in FIG. 6.

Fourth Embodiment

Figure 8:
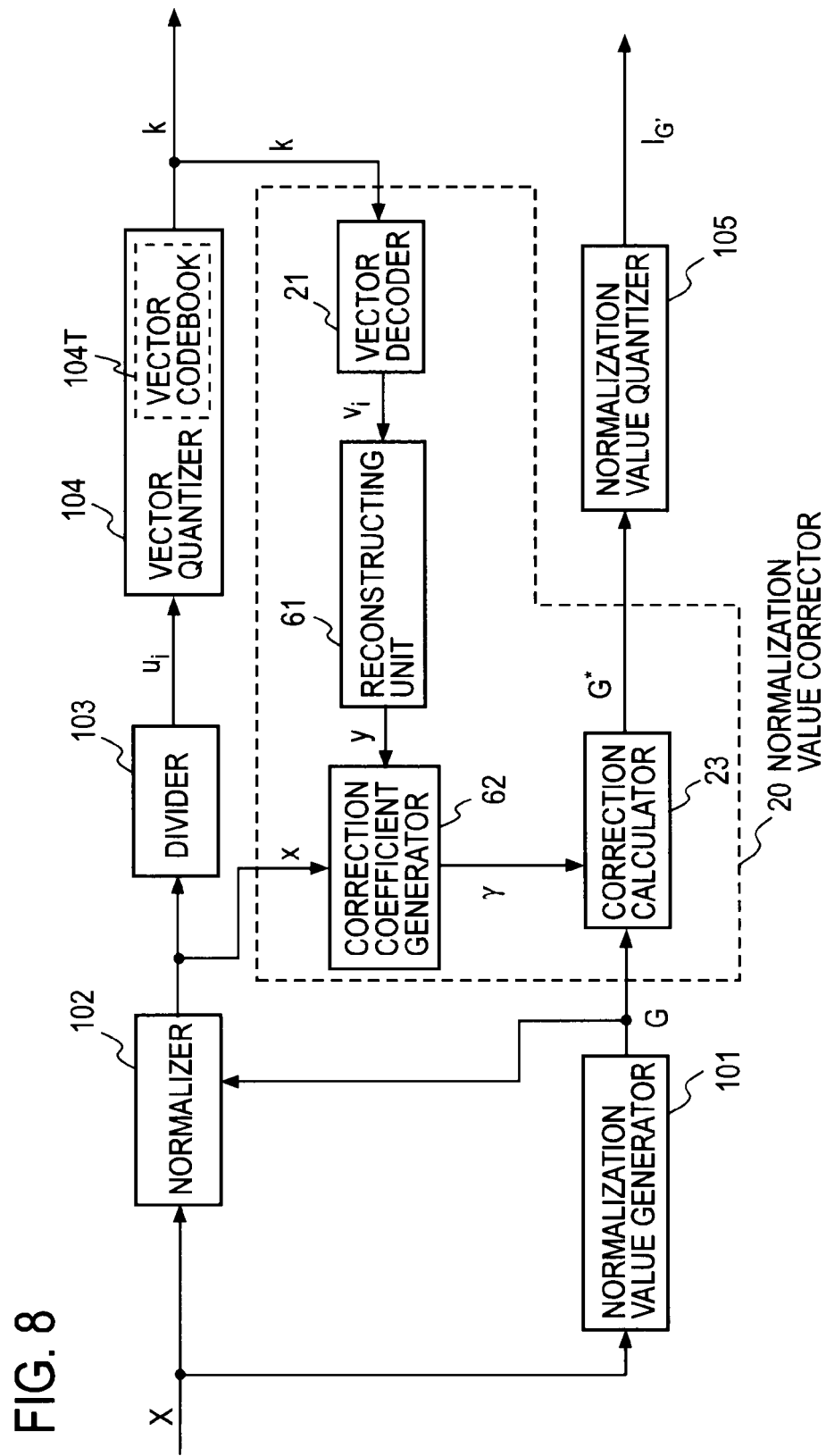
FIG. 8 shows an example of a functional structure of a coding apparatus according to a fourth embodiment of the present invention.
Figure 9:
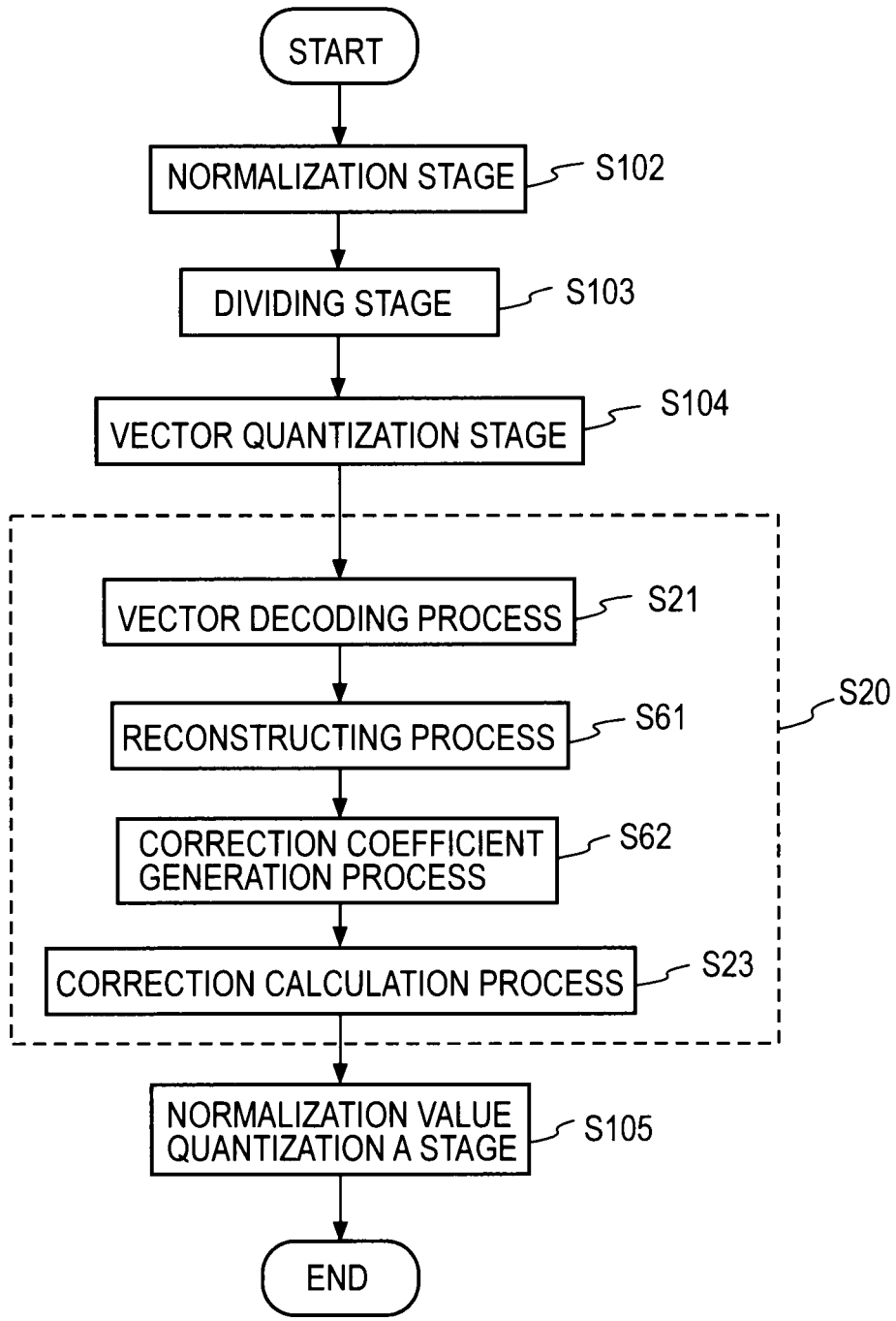
FIG. 9 shows an operation flow of the coding apparatus shown in FIG. 8.

FIG. 8 shows a functional structure of a coding apparatus of a fourth embodiment, using the coding method according to the present invention, and FIG. 9 shows its operation flow. The normalization value corrector 20 of the coding apparatus includes a vector decoder 21, a reconstructing unit 61, a correction coefficient generator 62, and a correction calculator 23. The other elements are the same as in the coding apparatus shown in FIG. 1, 4, or 6. The reconstructing unit 61 receives a plurality of divided output signal sequences $v_i$ from the vector decoder 21 and reconstructs a normalized output signal sequence y={$y_n$; n=0 to N−1} in accordance with a predetermined rule (step S61). For example, the divided output signal sequences $v_0$ to $v_3$ formed by division at intervals of four components shown in FIG. 3 are rearranged in the same order as the normalized input signal sequences $x_0$ to $x_{15}$. The normalized output signal sequence y is reconstructed by reversing the operation of the divider 103.

The correction coefficient generator 62 receives the normalized input signal sequence x and the normalized output signal sequence y and generates a correction coefficient γ by the calculation given by equation (16) (step S62).

$$\gamma = \frac{\sum_{n=0}^{N-1} x_n y_n}{\sum_{n=0}^{N-1} y_n^2} \quad (16)$$

Here, {$x_n$; n=0 to N−1} is a normalized input signal sequence; {$y_n$; n=0 to N−1} is a normalized output signal sequence; the subscript n is a sample number in the normalized signal sequence; and N is the number of samples contained in the normalized signal sequence, which indicates the frame length.

Like the coding apparatuses shown in FIGS. 1, 4, and 6, the coding apparatus structured as shown in FIG. 8 can perform coding with a high SNR. The conventional decoding apparatus shown in FIG. 28 can be directly used as a decoding apparatus corresponding to the coding apparatus shown in FIG. 8.

Fifth Embodiment

The coding apparatuses described above correct the normalization value G by the correction coefficient γ or the first correction coefficient $\beta_1$ and the second correction coefficient $\beta_2$, and output the quantization index $I_{G'}$ of the corrected normalization value G*. As in embodiments described later, a configuration may be made such that the normalization value G is not corrected but is quantized directly, and the quantization index is output; the quantization index of the correction coefficient γ is also output; and the decoded normalization value G' is corrected by a correction coefficient γ' on the decoding side.

Figure 10:
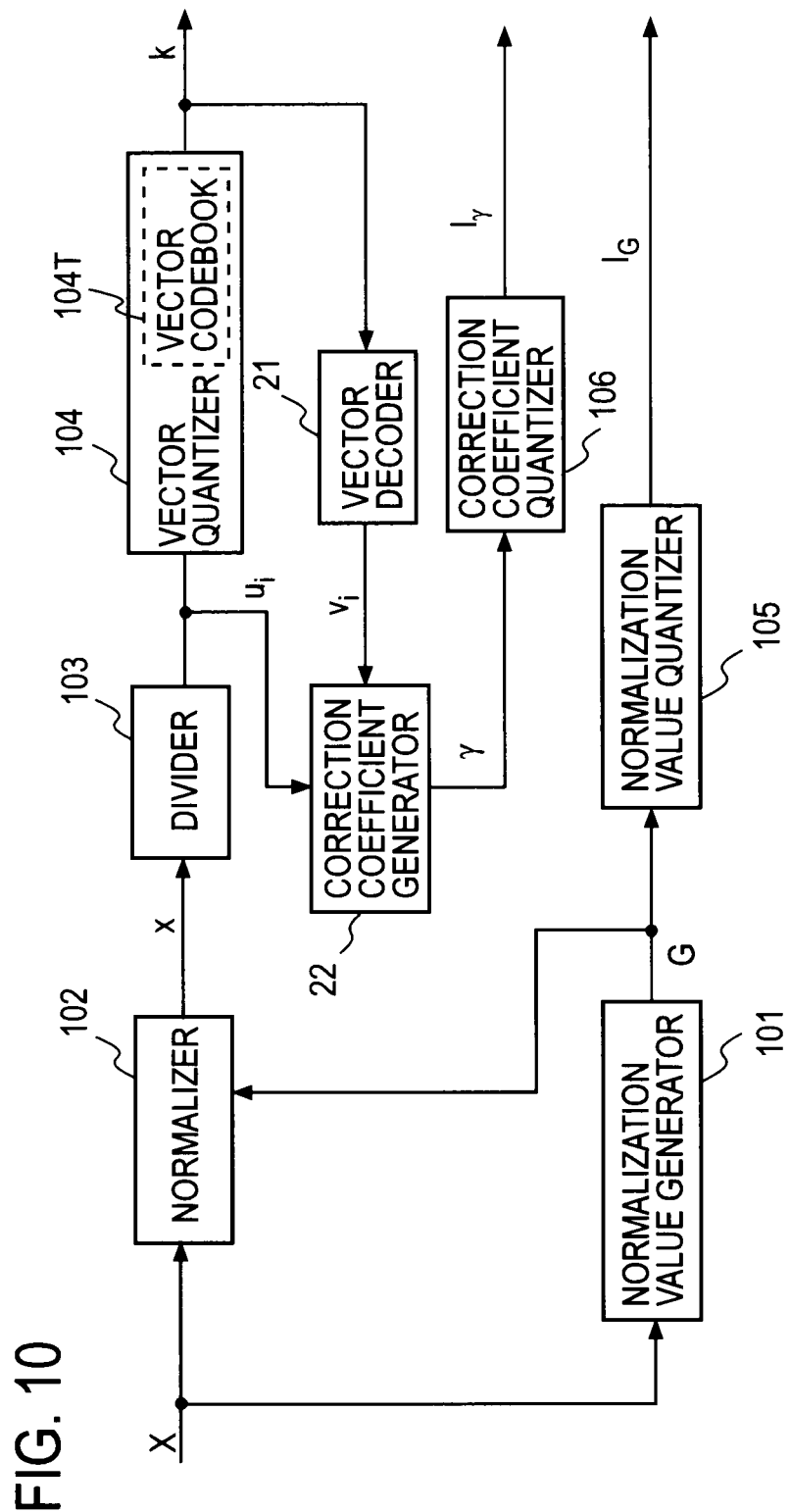
FIG. 10 shows an example of a functional structure of a coding apparatus according to a fifth embodiment of the present invention.

FIG. 10 shows a functional structure of a coding apparatus of such an embodiment. The fifth embodiment differs from the embodiment shown in FIG. 1 in the following points: The correction calculator 23 has been removed, and the normalization value G is given directly to the normalization value quantizer 105; a correction coefficient quantizer 106 is provided; and the correction coefficient γ generated by the correction coefficient generator 22 is quantized in the correction coefficient quantizer 106. The normalization value quantizer 105 quantizes the given normalization value G and outputs the normalization value quantization index $I_G$. The correction coefficient quantizer 106 quantizes the given correction coefficient γ and outputs the correction coefficient quantization index $I_γ$. The indexes k, $I_G$, and $I_γ$ generated by the coding apparatus are given to a decoding apparatus.

Figure 11:
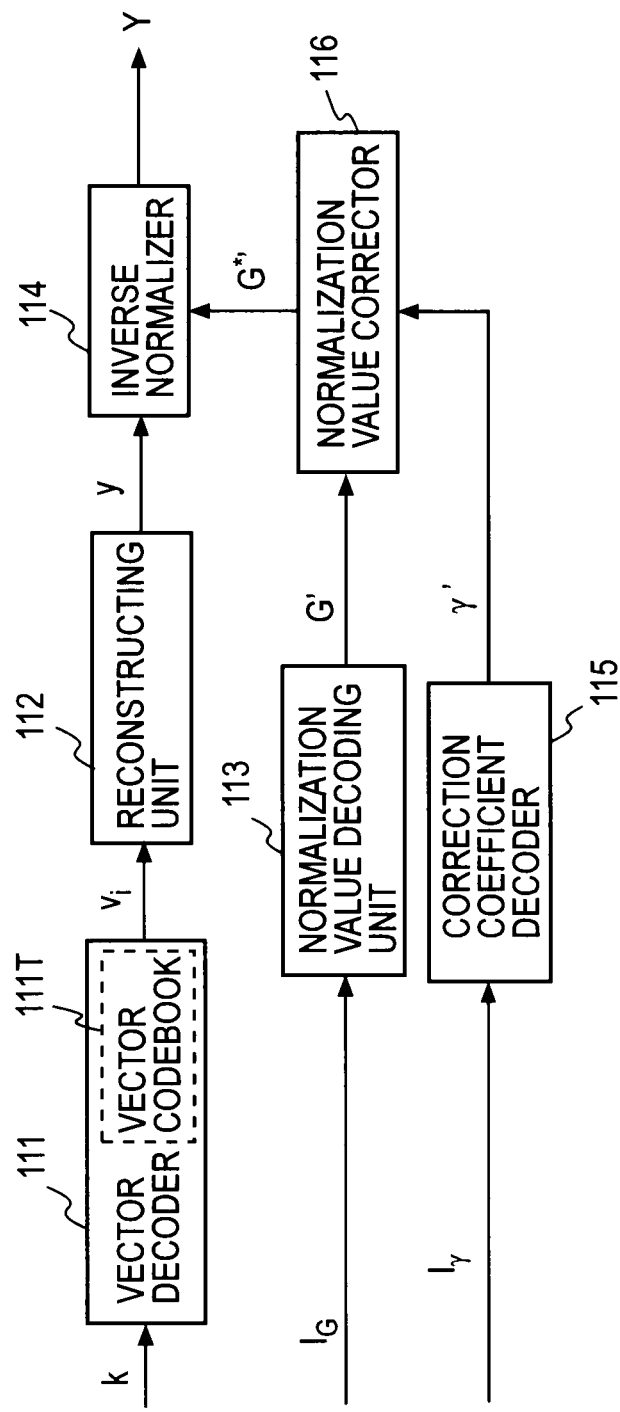
FIG. 11 shows a functional structure of a decoding apparatus corresponding to the coding apparatus shown in FIG. 10.

FIG. 11 shows a functional structure of the decoding apparatus corresponding to the coding apparatus shown in FIG. 10. The structure of the decoding apparatus differs from the conventional structure shown in FIG. 28 in that a correction coefficient decoder 115 and a normalization value corrector 116 are added. The correction coefficient decoder 115 decodes a given correction coefficient quantization index $I_γ$ and gives a decoded correction coefficient γ' to the normalization value corrector 116. The normalization value corrector 116 multiplies the decoded normalization value G' by the decoded correction coefficient γ' and gives a corrected decoded normalization value G*' to an inverse normalizer 114. The inverse normalizer 114 generates an output signal Y by multiplying the normalized output signal sequence y reconstructed by a reconstructing unit 112 by the corrected decoded normalization value G*'. The rest of the operation is the same as in FIG. 28.

FIG. 11 shows an example of multiplying the reconstructed output signal sequence y by the corrected decoded normalization value G*'=γ'G', which is the product of the decoded normalization value G' and the decoded correction coefficient γ'. However, the output $v_i$ of a vector decoder 111 may be multiplied by the corrected decoded normalization value G*', and the result of multiplication may be input to the reconstructing unit 112. Alternatively, $v_i$ may be multiplied by one of the decoded correction coefficient γ' and the decoded normalization value G', and the result may be given to the reconstructing unit 112; and the output of the reconstructing unit 112 may be multiplied by the other of the two to produce an output signal Y. This can be applied to the other decoding apparatuses.

Sixth Embodiment

Figure 12:
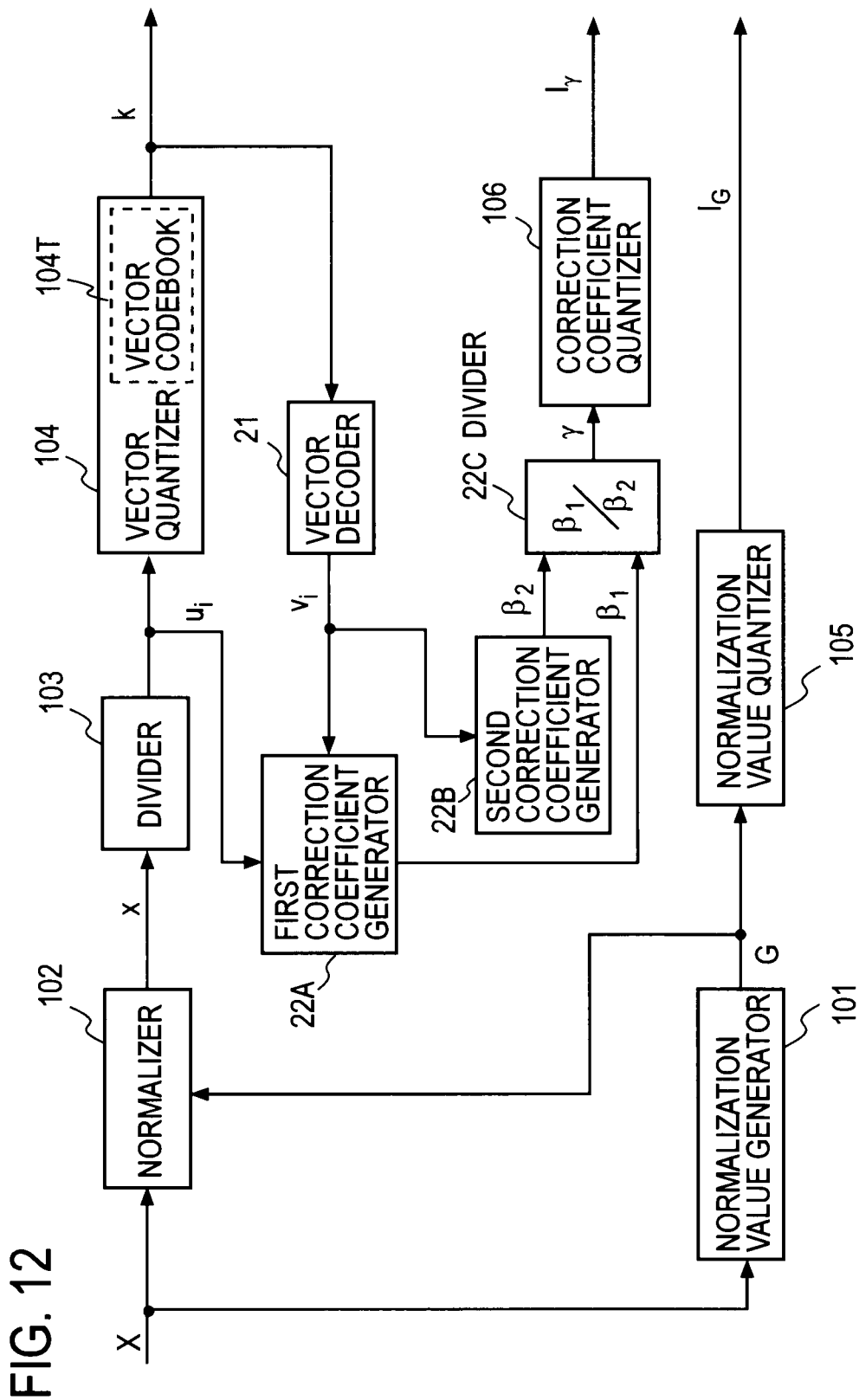
FIG. 12 shows an example of a functional structure of a coding apparatus according to a sixth embodiment of the present invention.

FIG. 12 shows a functional structure of a coding apparatus of a sixth embodiment. This embodiment is provided by applying the correction coefficient calculation method in FIG. 6 to the embodiment shown in FIG. 10. Instead of the correction coefficient generator 22 in FIG. 10, a first correction coefficient generator 22A, a second correction coefficient generator 22B, and a divider 22C are provided. The first correction coefficient generator 22A and the second correction coefficient generator 22B calculate a first correction coefficient $β_1$ and a second correction coefficient $β_2$, respectively, as given by equation (14), in the same way as in FIG. 6. The divider 22C divides the first correction coefficient $β_1$ by the second correction coefficient $β_2$ to generate a correction coefficient γ and gives it to a correction coefficient quantizer 106. The rest of the operation is the same as in FIG. 10. The indexes k, $I_G$, and $I_γ$ output from the coding apparatus in FIG. 12 can be decoded by the decoding apparatus shown in FIG. 11.

Seventh Embodiment

Figure 13:
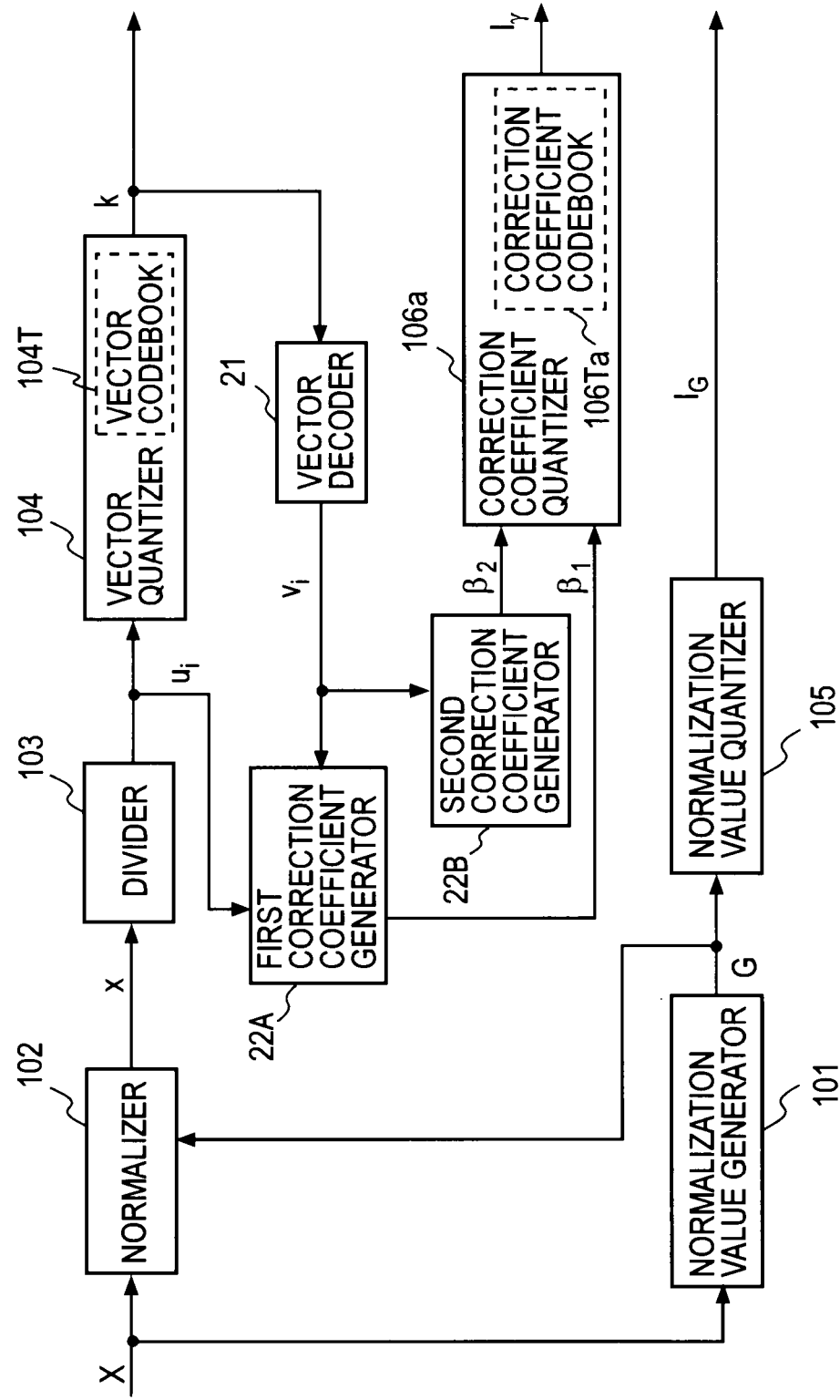
FIG. 13 shows an example of a functional structure of a coding apparatus according to a seventh embodiment of the present invention.

FIG. 13 shows a functional structure of a coding apparatus of a seventh embodiment. In the embodiment shown in FIG. 12, the correction coefficient γ is obtained from the first correction coefficient $β_1$ and the second correction coefficient $β_2$, the correction coefficient γ is quantized, and the correction coefficient quantization index $I_γ$ is output. In the embodiment shown in FIG. 13, the correction coefficient quantization index $I_γ$ is obtained directly from the first correction coefficient $β_1$ and the second correction coefficient $β_2$.

The quantized correction coefficient γ' corresponding to the correction coefficient quantization index $I_γ$ is determined to minimize the error d' given by equation (3). Equation (3) can be rewritten as follows.

$$d' = G^2 \sum_{i=0}^{M-1} \sum_{j=0}^{h(i)-1} (u_{i,j} - γ' v_{i,j})^2 \qquad (17)$$
$$= G^2 \left( \sum_{i=0}^{M-1} \sum_{j=0}^{h(i)-1} u_{i,j}^2 - 2γ' \sum_{i=0}^{M-1} \sum_{j=0}^{h(i)-1} u_{i,j} v_{i,j} + γ'^2 \sum_{i=0}^{M-1} \sum_{j=0}^{h(i)-1} v_{i,j}^2 \right)$$

If the divided output signal sequence $v_i$, which is the result of vector quantization on the divided input signal sequence $u_i$, is obtained, γ' that minimizes the error d' given by equation (17) can be specified by determining γ' that minimizes the following equation.

$$d' = -2γ' \sum_{i=0}^{M-1} \sum_{j=0}^{h(i)-1} u_{i,j} v_{i,j} + γ'^2 \sum_{i=0}^{M-1} \sum_{j=0}^{h(i)-1} v_{i,j}^2 \qquad (18)$$

This means that the quantized correction coefficient γ' should be determined to minimize equation (18). Equation (18) can be rewritten as follows, by using equations (14) and (15).

$$d'' = -2γ'β_1 + γ'^2 β_2 \qquad (19)$$

The structure of the coding apparatus shown in FIG. 13 differs from the structure shown in FIG. 12 in the following points: The divider 22C has been removed, and a correction coefficient quantizer 106a is provided instead of the correction coefficient quantizer 106. The correction coefficient quantizer 106a has a correction coefficient codebook 106Ta which holds a plurality of predetermined quantized correction coefficients γ' in association with indexes $I_γ$. The first correction coefficient $β_1$ and the second correction coefficient $β_2$ from the first correction coefficient generator 22A and the second correction coefficient generator 22B are given to the correction coefficient quantizer 106a. The correction coefficient quantizer 106a searches through the correction coefficient codebook 106Ta for a quantized correction coefficient γ' that minimizes the error d'' given by equation (19) and outputs its correction coefficient quantization index $I_γ$. The rest of the operation is the same as in FIG. 12. The decoding apparatus shown in FIG. 11 can be used as a decoding apparatus corresponding to the coding apparatus shown in FIG. 13.

Eighth Embodiment

Figure 14:
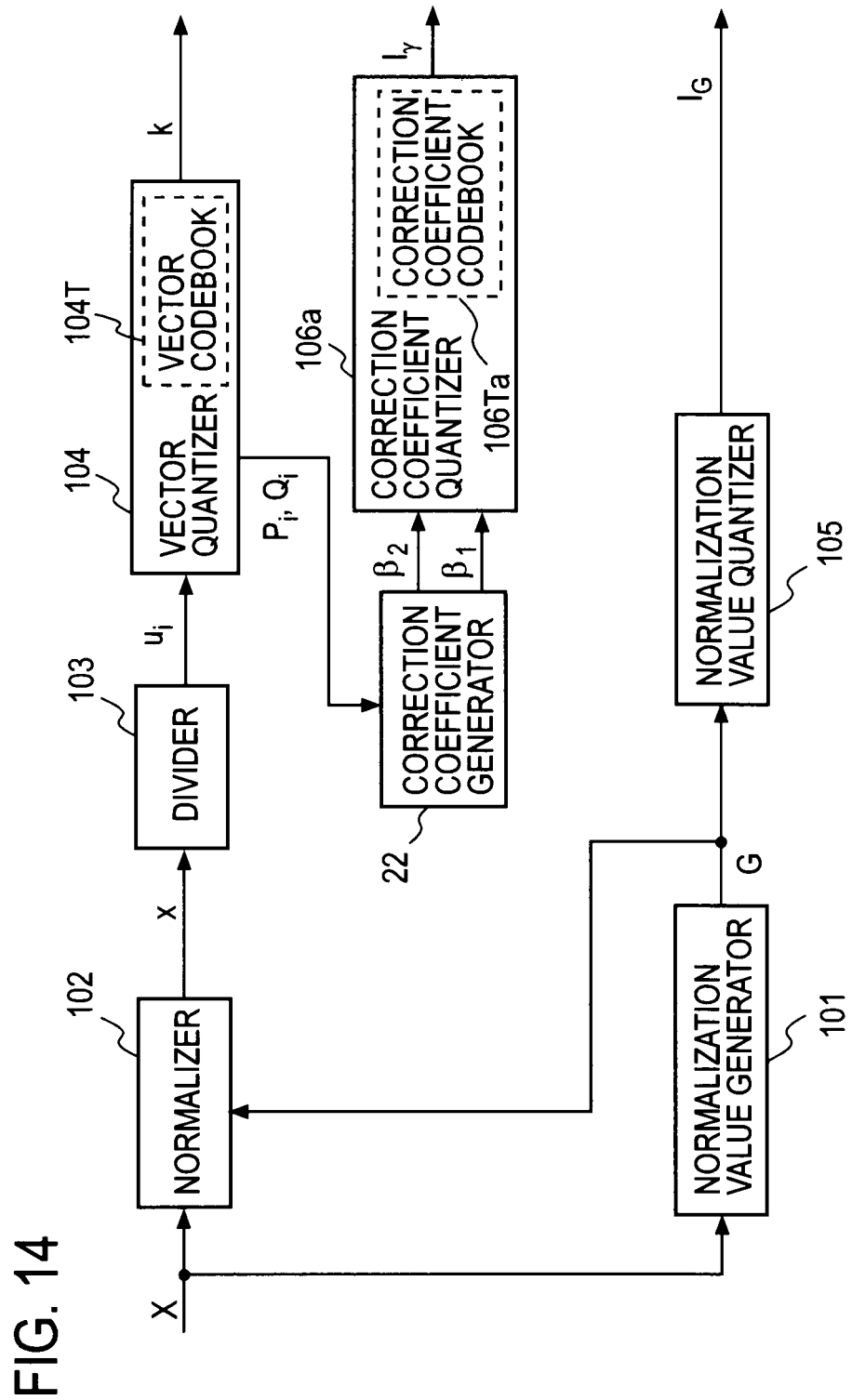
FIG. 14 shows an example of a functional structure of a coding apparatus according to an eighth embodiment of the present invention.

FIG. 14 is a modified embodiment of the coding apparatus shown in FIG. 13. Instead of the vector decoder 21, the first correction coefficient generator 22A, and the second correction coefficient generator 22B shown in FIG. 13, the correction coefficient generator 22 described with reference to FIG. 4 is provided. A vector quantizer 104 gives the correction coefficient generator 22 the values $P_i$ and $Q_i$ calculated when applying vector quantization to the divided input signal sequence $u_i$, as given by equations (12a) and (12b). The correction coefficient generator 22 calculates a first correction coefficient $\beta_1$ and a second correction coefficient $\beta_2$ from $P_i$ and $Q_i$, as given by the following equation, and gives them to the correction coefficient quantizer 106a.

$$\beta_1 = \sum_{i=0}^{M-1} P_i; \beta_2 = \sum_{i=0}^{M-1} Q_i$$

The rest of the operation is the same as in FIG. 13. The decoding apparatus shown in FIG. 11 can be used as a decoding apparatus corresponding to the coding apparatus in FIG. 14.

Ninth Embodiment

Figure 15:
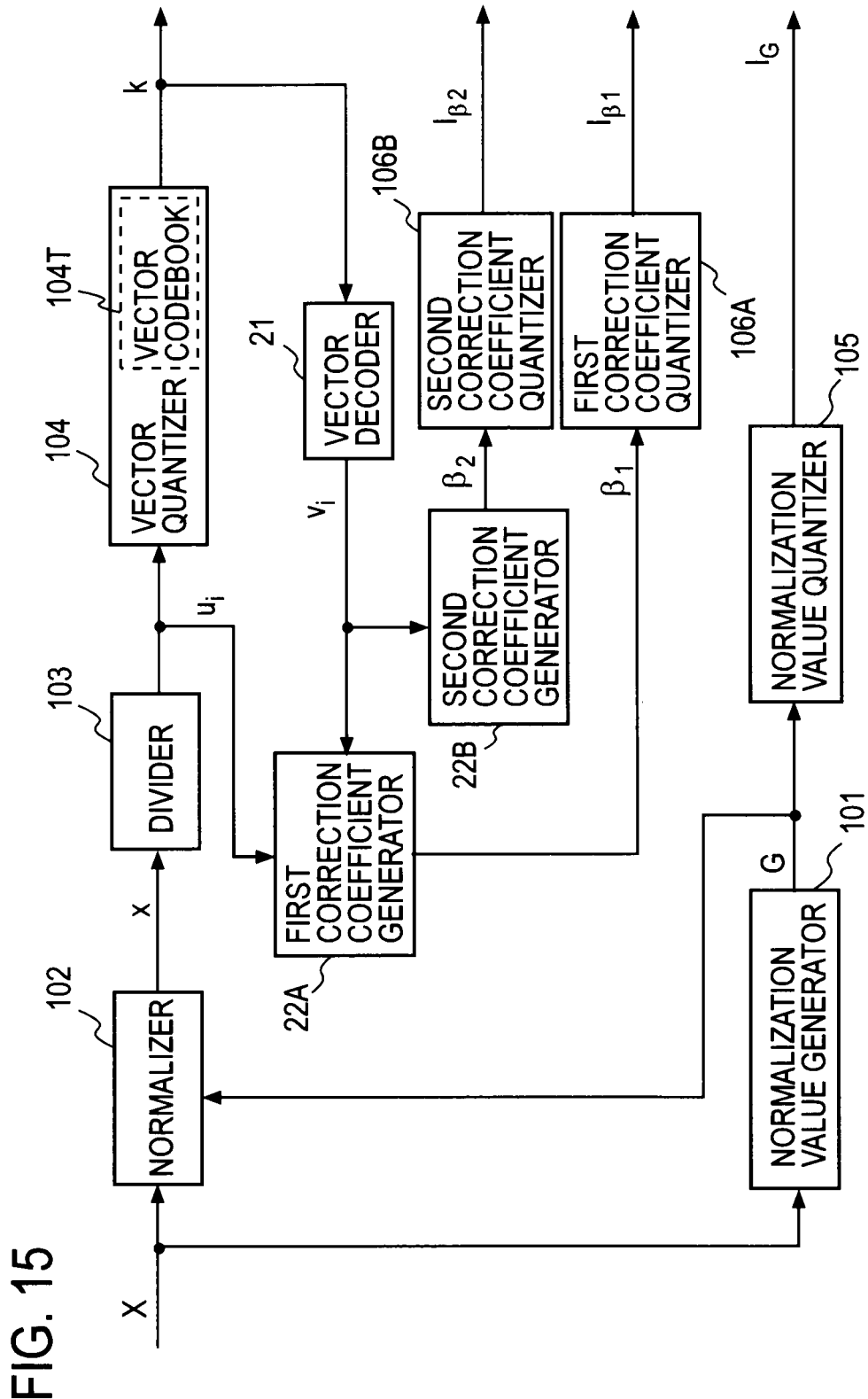
FIG. 15 shows an example of a functional structure of a coding apparatus according to a ninth embodiment of the present invention.

FIG. 15 shows a functional structure of a coding apparatus of a ninth embodiment. The structure of this embodiment differs from the structure shown in FIG. 12 in that a first correction coefficient quantizer 106A and a second correction coefficient quantizer 106B are provided instead of the divider 22C and the correction coefficient quantizer 106. The first correction coefficient quantizer 106A and the second correction coefficient quantizer 106B quantize the first correction coefficient $\beta_1$ and the second correction coefficient $\beta_2$ given from the first correction coefficient generator 22A and the second correction coefficient generator 22B, respectively, and output a first correction coefficient quantization index $I_{\beta 1}$ and a second correction coefficient quantization index $I_{\beta 2}$ The rest of the operation is the same as in FIG. 12.

Figure 16:
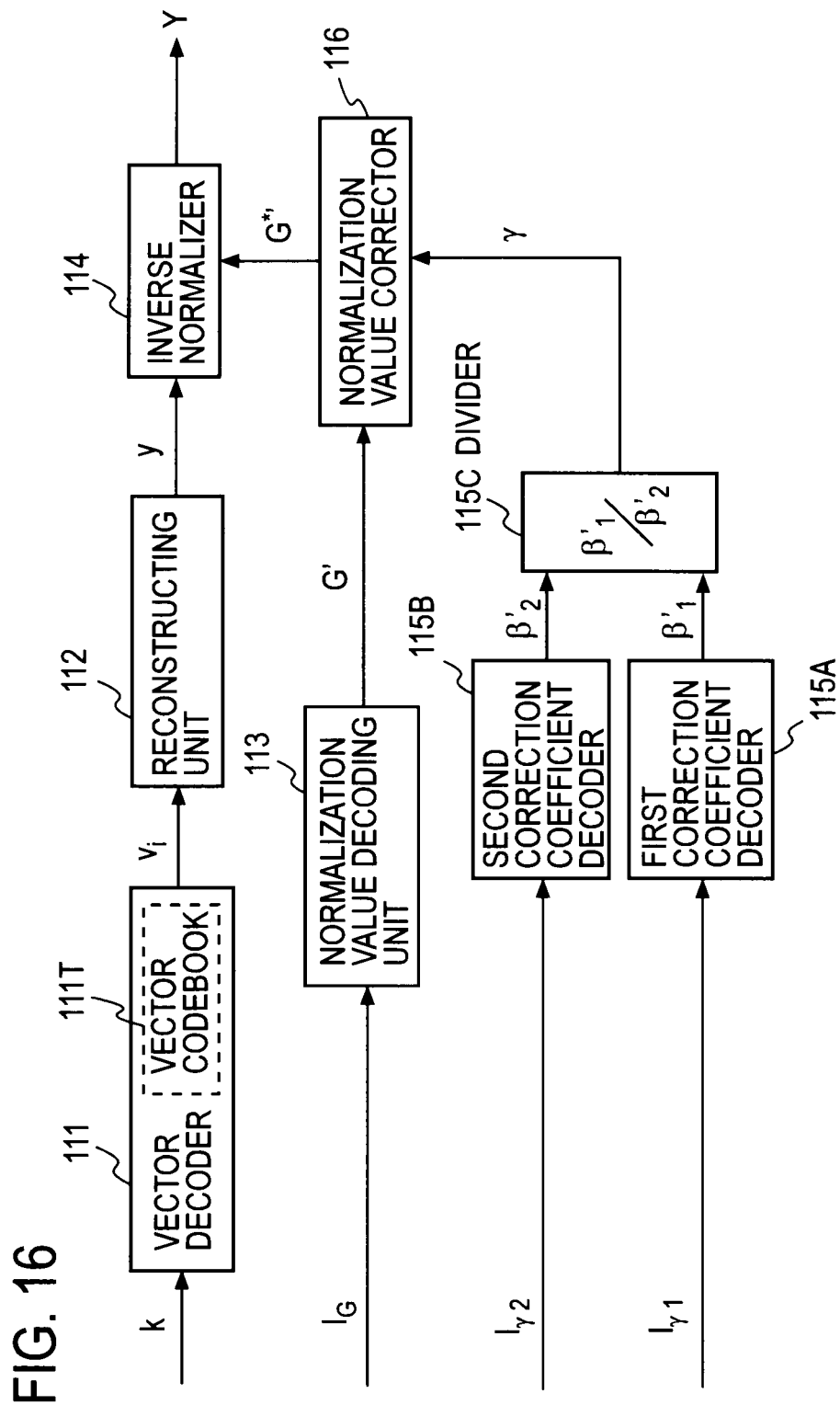
FIG. 16 shows a functional structure of a decoding apparatus corresponding to the coding apparatus shown in FIG. 15.

FIG. 16 shows a functional structure of a decoding apparatus corresponding to the coding apparatus shown in FIG. 15. The structure differs from the structure of the decoding apparatus shown in FIG. 11 in that a first correction coefficient decoder 115A, a second correction coefficient decoder 115B, and a divider 115C are provided instead of the correction coefficient decoder 115. A first correction coefficient quantization index $I_{\beta 1}$ and a second correction coefficient quantization index $I_{\beta 2}$ given from the coding apparatus are decoded by the first correction coefficient decoder 115A and the second correction coefficient decoder 115B, respectively, and a first decoded correction coefficient $\beta_1'$ and a second decoded correction coefficient $\beta_2'$ are output. The divider 115C generates the decoded correction coefficient $\gamma'$ by dividing $\beta_1'$ by $\beta_2'$ and gives it to the normalization value corrector 116. The calculation by the normalization value corrector 116 and the inverse normalizer 114 may be performed in any order if each sample of y multiplied by $\beta_1'G'/\beta_2'$ can be obtained at last as a respective sample of Y. The rest of the operation is the same as in FIG. 11.

Tenth Embodiment

In each of the embodiments described above, the coding apparatus determines the correction coefficient $\gamma$ or the first correction coefficient $\beta_1$ and the second correction coefficient $\beta_2$ in each frame, and the decoding apparatus corrects the normalization value in each frame. In a tenth embodiment, a coding apparatus specifies a correction coefficient $\gamma_i$ for each divided input signal sequence $u_i$, and a decoding apparatus multiplies each divided output signal sequence $v_i$ by the corresponding correction coefficient $\gamma_i'$, so that the normalization error is made small.

Figure 17:
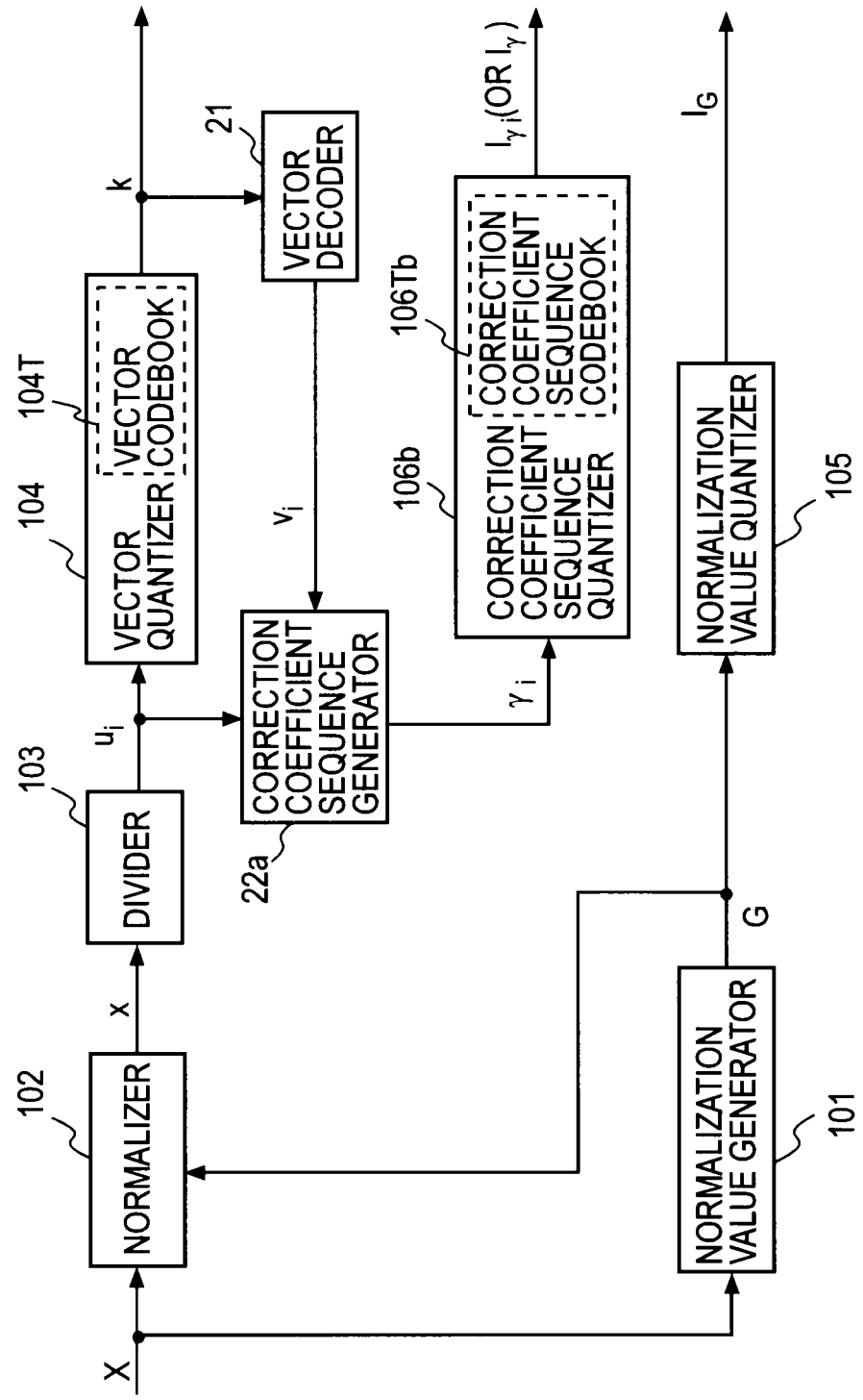
FIG. 17 shows an example of a functional structure of a coding apparatus according to a tenth embodiment of the present invention.

FIG. 17 shows a functional structure of the coding apparatus of the tenth embodiment. The structure differs from the structure shown in FIG. 10 in that the correction coefficient generator 22 and the correction coefficient quantizer 106 are replaced by a correction coefficient sequence generator 22a and a correction coefficient sequence quantizer 106b. The correction coefficient sequence generator 22a calculates a per-division correction coefficient $\gamma_i$ (i=0 to M−1), as given by the following equation, from the divided input signal sequence $u_i$ and the corresponding divided output signal sequence $v_i$.

$$\gamma_i = \frac{\sum_{j=0}^{h(i)-1} u_{i,j} v_{i,j}}{\sum_{j=0}^{h(i)-1} v_{i,j}^2} \tag{20}$$

If a single frame is divided into M parts, M per-division correction coefficients $\gamma_i$ (i=0 to M−1) is obtained. The correction coefficient sequence quantizer 106b performs scalar quantization of the obtained per-division correction coefficient sequence $\gamma_i$ and outputs a quantization index $I_{\gamma i}$ (i=0 to M−1) of each per-division correction coefficient. Alternatively, the correction coefficient sequence quantizer 106b performs vector quantization of the correction coefficient sequence $\gamma_i$ and outputs a correction coefficient vector quantization index $I_\gamma$. In the latter case, the correction coefficient sequence quantizer 106b has a correction coefficient sequence codebook 106Tb which associates the correction coefficient representative vector $\gamma'$ with the index $I_\gamma$.

$$\varepsilon = \sum_{i=0}^{M-1} (\gamma_i - \gamma_i')^2 \tag{21}$$

The correction coefficient sequence quantizer 106b finds the correction coefficient representative vector $\gamma'_i$ that minimizes the error $\varepsilon$ given by the foregoing equation, from the correction coefficient sequence codebook 106Tb, and outputs the corresponding index $I_\gamma$.

Figure 18:
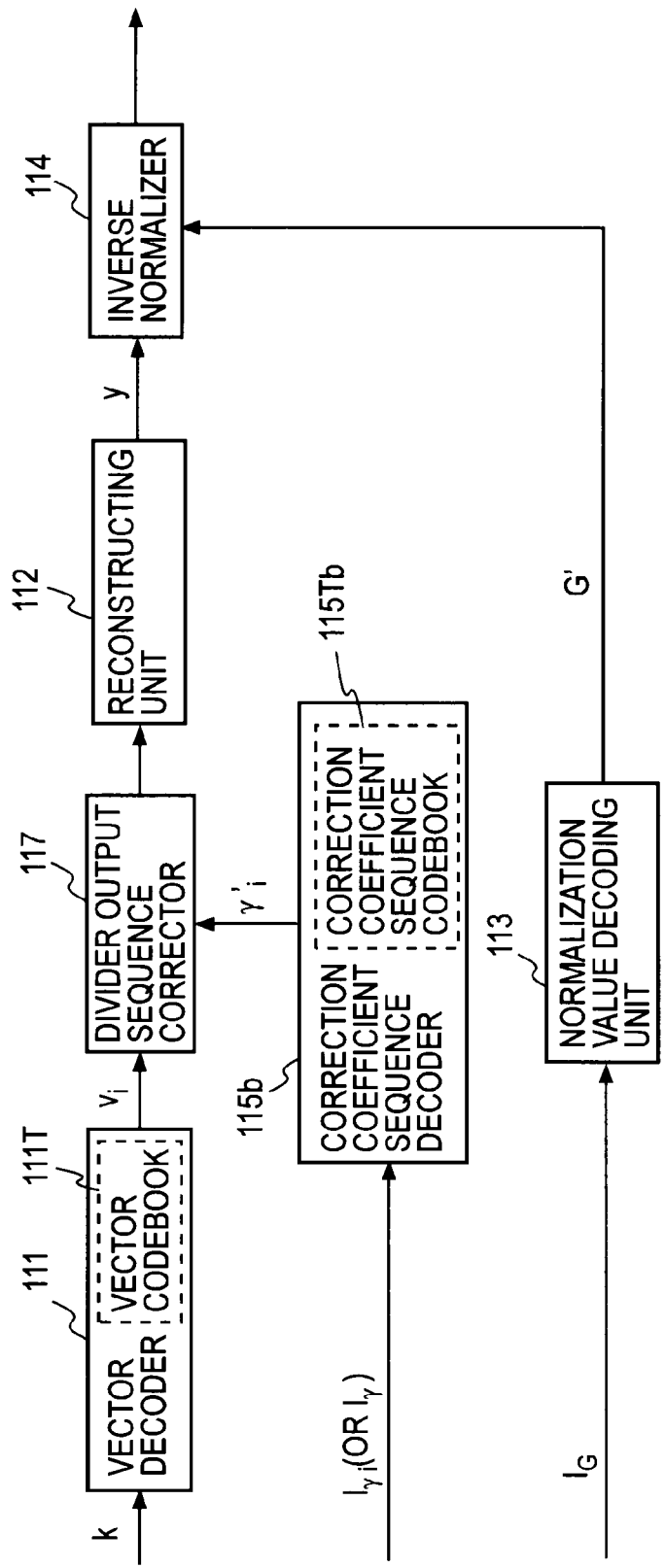
FIG. 18 shows a functional structure of a decoding apparatus corresponding to the coding apparatus shown in FIG. 17.

FIG. 18 shows a functional structure of the decoding apparatus, corresponding to the coding apparatus shown in FIG. 17. The decoding apparatus differs from the decoding apparatus shown in FIG. 28 in that a correction coefficient sequence decoder 115b is provided, and a divided output sequence corrector 117 is provided between the vector decoder 111 and the reconstructing unit 112. The correction coefficient sequence decoder 115b decodes the input correction coefficient sequence quantization index $I_{\gamma i}$ or the correction coefficient vector quantization index $I_\gamma$, generates a sequence of decoded correction coefficients $\gamma_i'$, and gives it to the divided output sequence corrector 117. If the correction coefficient sequence quantizer 106b of the coding apparatus shown in FIG. 17 performs vector quantization, the correction coefficient sequence decoder 115b has a correction coefficient sequence codebook 115Tb, which is the same as the correction coefficient sequence codebook 106Tb, for vector quantization. The divided output sequence corrector 117 multiplies each divided output signal sequence $v_i$ by the corresponding decoded correction coefficient $\gamma_i$ and gives the result of multiplication to the reconstructing unit 112. The rest of the operation is the same as in FIG. 28.

Eleventh Embodiment

Figure 19:
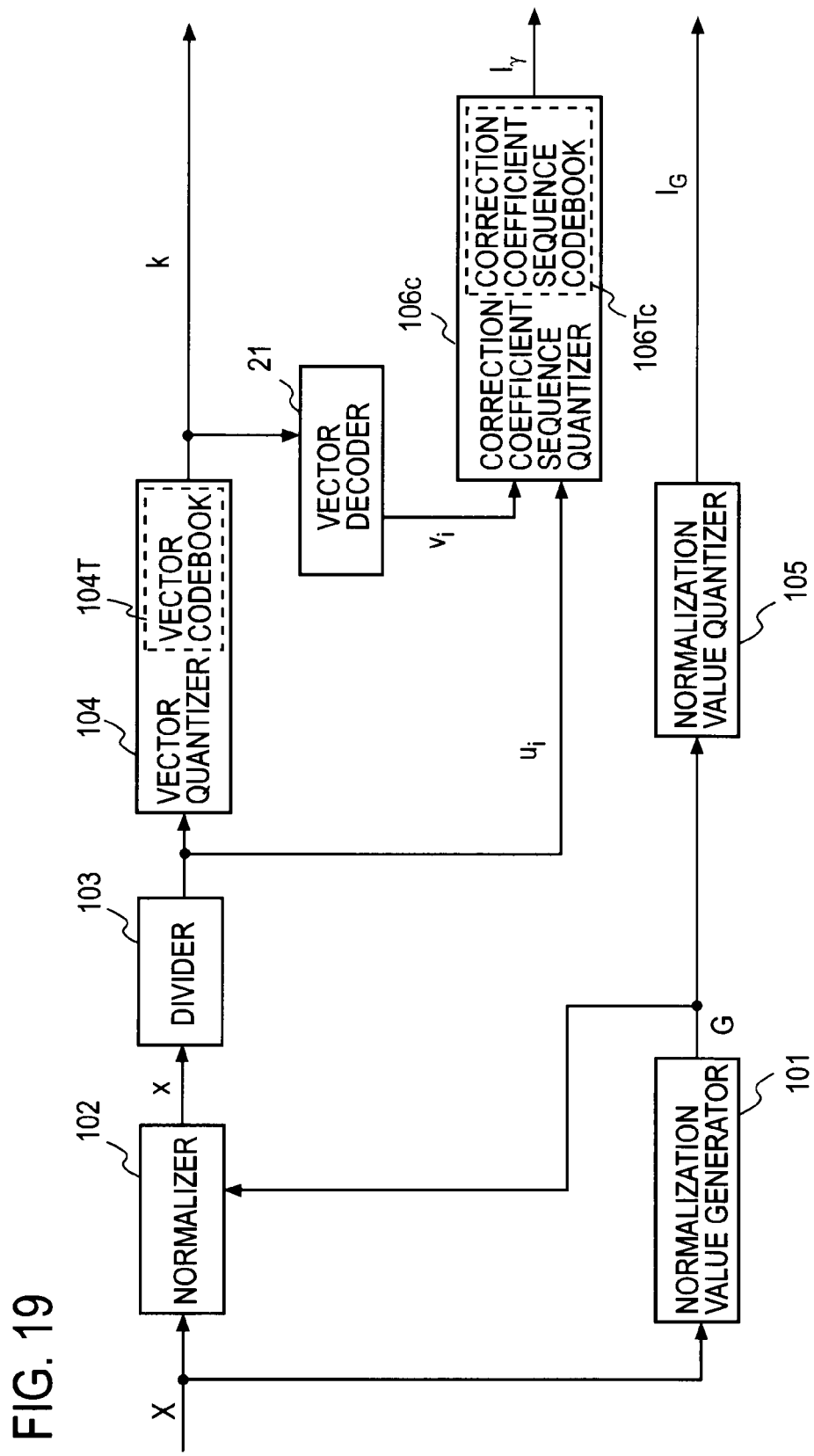
FIG. 19 shows an example of a functional structure of a coding apparatus according to an eleventh embodiment of the present invention.

FIG. 19 shows a functional structure of a coding apparatus of an eleventh embodiment. This embodiment differs from the embodiment shown in FIG. 17 in the following points: The correction coefficient sequence generator 22a has been removed; instead of the correction coefficient sequence quantizer 106b, a correction coefficient sequence quantizer 106c is used to obtain a correction coefficient vector quantization index $I_\gamma$, which corresponds to a sequence of quantized correction coefficients $\gamma_i'$ that minimizes the error, directly from the divided input signal sequence $x_{i,j}$ and the corresponding divided output signal sequence $v_i$, with reference to a correction coefficient sequence codebook 106Tc. The correction coefficient sequence codebook 106Tc of the correction coefficient sequence quantizer 106c holds a plurality of correction coefficient representative vectors in association with correction coefficient vector quantization indexes $I_\gamma$, and the correction coefficient sequence quantizer 106c determines a correction coefficient vector quantization index $I_\gamma$, which corresponds to a sequence of quantized correction coefficients $\gamma_i'$ that minimizes the error $\epsilon$ given by the following equation, from the given divided input signal sequence $u_i$ and the corresponding divided output signal sequence $v_i$, with reference to the correction coefficient sequence codebook 106Tc.

$$\varepsilon = \sum_{i=0}^{M-1} \left( \sum_{j=0}^{h(i)-1} u_{i,j}^2 - 2\gamma_i' \sum_{j=0}^{h(i)-1} u_{i,j} v_{i,j} + \gamma_i'^2 \sum_{j=0}^{h(i)-1} v_{i,j}^2 \right) \quad (22)$$

In this case, a correction coefficient vector quantization index $I\gamma$ corresponding to the sequence of $\gamma_i'$ that minimizes the following equation, instead of equation (22), should be sought from the correction coefficient sequence codebook 106Tc.

$$\varepsilon' = \sum_{i=0}^{M-1} \left( -2\gamma_i' \sum_{j=0}^{h(i)-1} u_{i,j} v_{i,j} + \gamma_i'^2 \sum_{j=0}^{h(i)-1} v_{i,j}^2 \right) \quad (23)$$

The rest of the operation is the same as in FIG. 17. The decoding apparatus shown in FIG. 18 can be used as a decoding apparatus corresponding to the coding apparatus shown in FIG. 19.

Twelfth Embodiment

Figure 20:
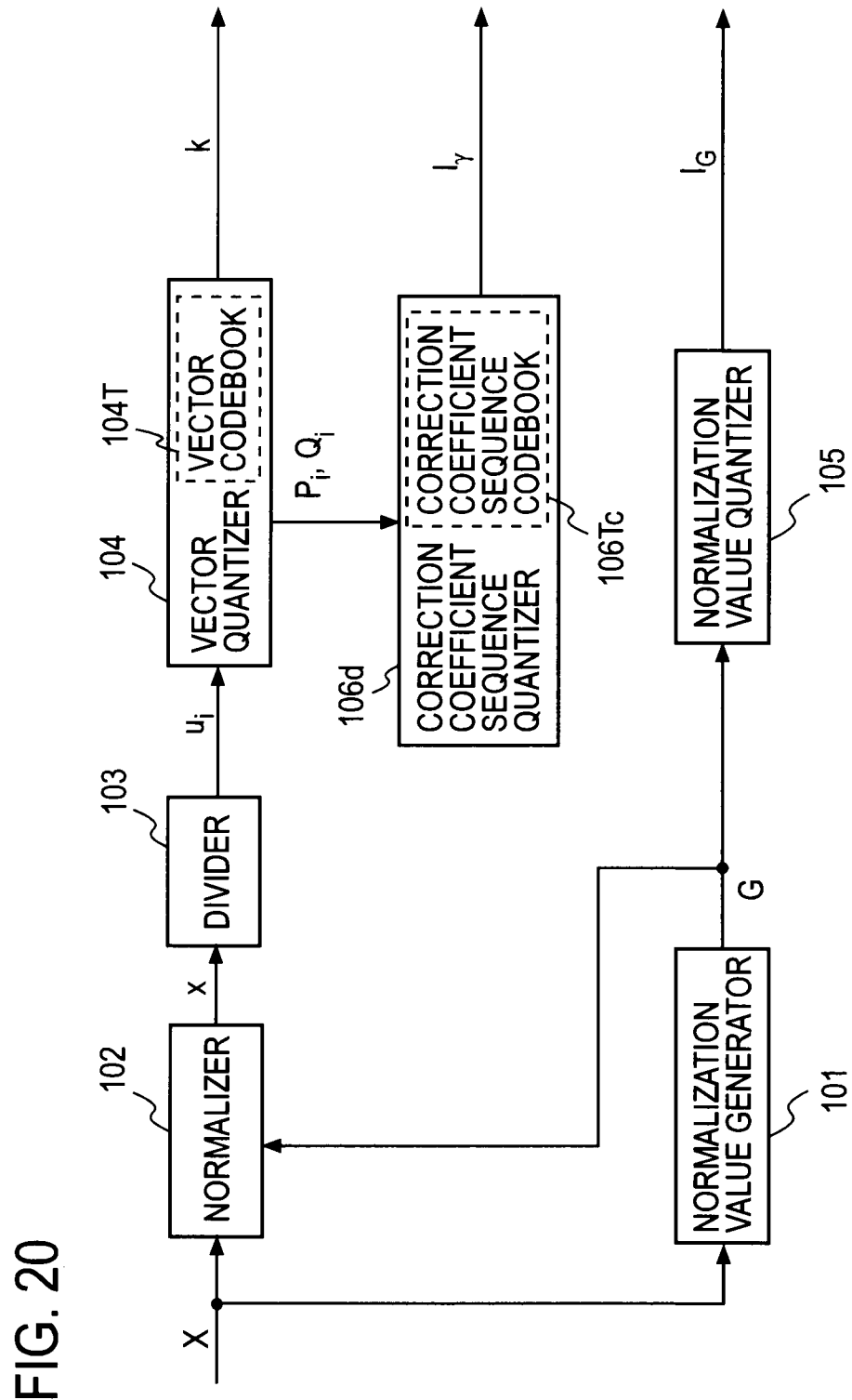
FIG. 20 shows an example of a functional structure of a coding apparatus according to a twelfth embodiment of the present invention.

FIG. 20 shows a functional structure of a coding apparatus of a twelfth embodiment. The embodiment shown in FIG. 20 is a modified embodiment of the coding apparatus shown in FIG. 19. When equation (23) is transformed by using equations (12a) and (12b), the following equation is given.

$$\varepsilon' = \sum_{i=0}^{M-1} (-2\gamma_i' P_i + \gamma_i'^2 Q_i) \quad (24)$$

As has been described with reference to FIG. 4, $P_i$ and $Q_i$ have been calculated in vector quantization of the divided input signal sequence $u_i$ by the vector quantizer 104. In this embodiment, the vector decoder 21 is not used, and the vector quantizer 104 gives $P_i$ and $Q_i$ to a correction coefficient sequence quantizer 106d. The same codebook as the correction coefficient sequence codebook 106Tc used in FIG. 19 is used, and a correction coefficient vector quantization index $I_\gamma$ corresponding to a sequence of quantized correction coefficients $\gamma_i'$, which minimizes the error $\epsilon'$ given by equation (24) is output. The rest of the operation is the same as in FIG. 19. When the decoding apparatus shown in FIG. 18 uses the same codebook as the correction coefficient sequence codebook 106Tc shown in FIG. 20 instead of the correction coefficient sequence codebook 115Tb, the decoding apparatus can be used as a decoding apparatus in this embodiment.

Thirteenth Embodiment

The coding apparatuses shown in FIGS. 17, 19, and 20 obtain the correction coefficient $\gamma_i$ for each divided signal sequence and output its quantization index. The decoding apparatus shown in FIG. 18 corrects each divided output signal sequence $v_i$ by the corresponding correction coefficient. In the thirteenth embodiment, a divided input normalization value $g_i$ is generated for each divided input signal sequence $u_i$; the divided input signal sequence $u_i$ is normalized with the divided input normalization value $g_i$; and a sequence of correction coefficients is generated to minimize the normalization error.

Figure 21:
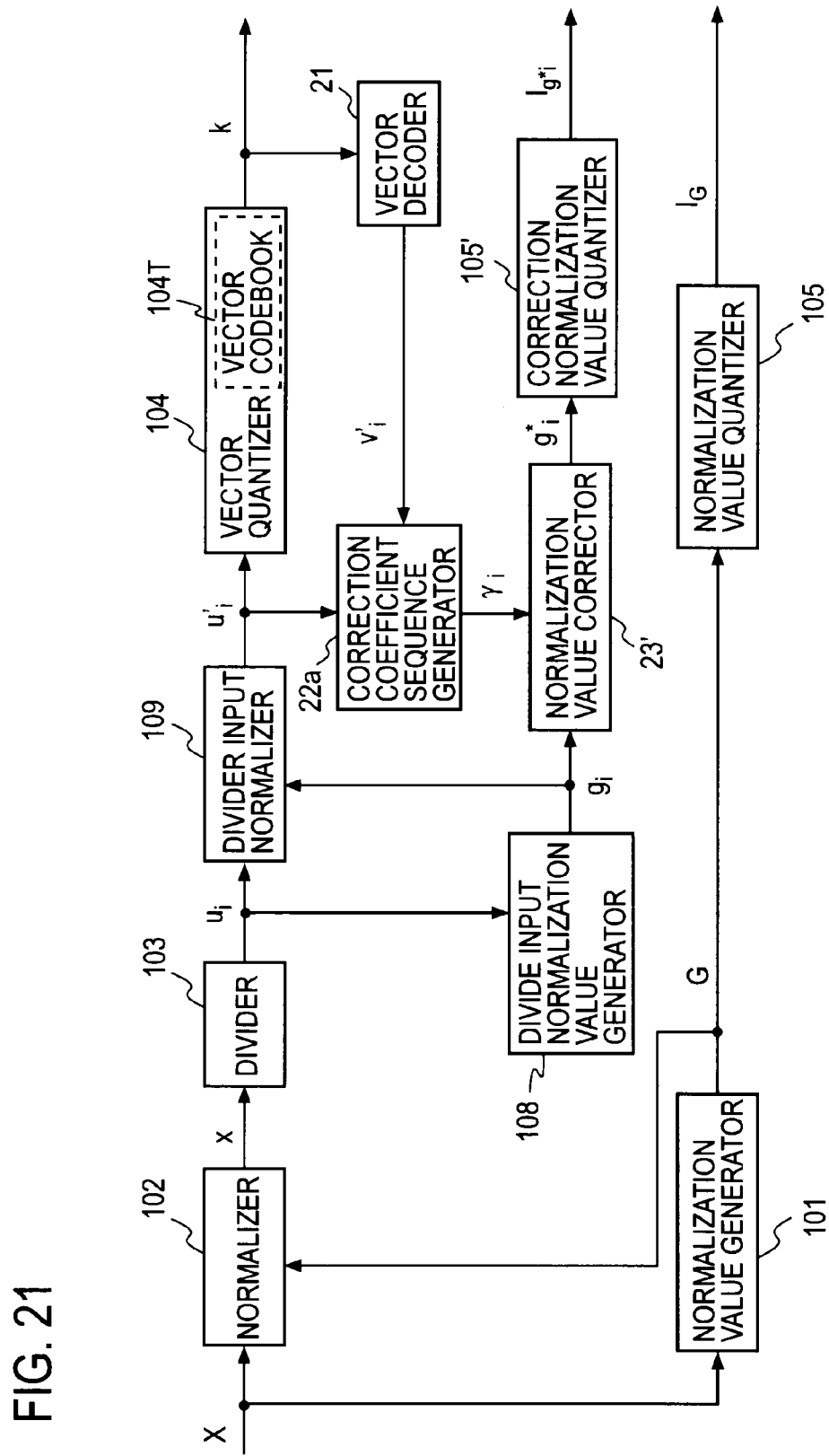
FIG. 21 shows an example of a functional structure of a coding apparatus according to a thirteenth embodiment of the present invention.

FIG. 21 shows a functional structure of a coding apparatus of a thirteenth embodiment; a normalization value generator 101, a normalizer 102, a divider 103, a vector quantizer 104, and a normalization value quantizer 105 are provided as in the coding apparatuses of the embodiments described above. Further, in this embodiment, a divided input normalizer 109 is provided between the divider 103 and the vector quantizer 104; and a divided input normalization value generator 108 for generating a divided input normalization value $g_i$ to be given to the divided input normalizer 109, a correction coefficient sequence generator 22a for generating a sequence of correction coefficients $\gamma_i$, a normalization value corrector 23', and a corrected normalization value quantizer 105' are provided.

The divided input normalization value generator 108 calculates the divided input normalization value $g_i$ from the divided input signal sequence $u_i$, as given by the following equation, for example.

$$g_i = \sqrt{\frac{\sum_{j=0}^{h(i)-1} u_{i,j}^2}{h(i)}} \quad (25)$$

The divided input normalizer 109 outputs, as a normalized divided input signal sequence $u_i'$, a sequence of samples obtained by dividing each sample of the divided input signal sequence $u_i$ by the divided input normalization value $g_i$. The correction coefficient sequence generator 22a generates a sequence of correction coefficients $\gamma_i$ from the normalized divided input signal sequence $u_i'$ and the normalized divided output signal sequence $v_i'$ from a vector decoder 21. The calculation method according to equation (20) explained with reference to FIG. 17, for example, can be used as a method of calculating the sequence of correction coefficients $\gamma_i$. In that case, $u_i'$ and $v_i'$ are used instead of $u_i$ and $v_i$.

The normalization value corrector 23' generates a corrected divided input normalization value $g^*_i$ by multiplying the sequence of correction coefficients $\gamma_i$ by the divided input normalization value $g_i$. The corrected normalization value quantizer 105' quantizes the corrected divided input normalization value $g^*_i$ by the same method as the correction coefficient sequence quantizer 106b shown in FIG. 17 and outputs the corresponding corrected normalization value quantization index $I_{g*i}$.

Figure 22:
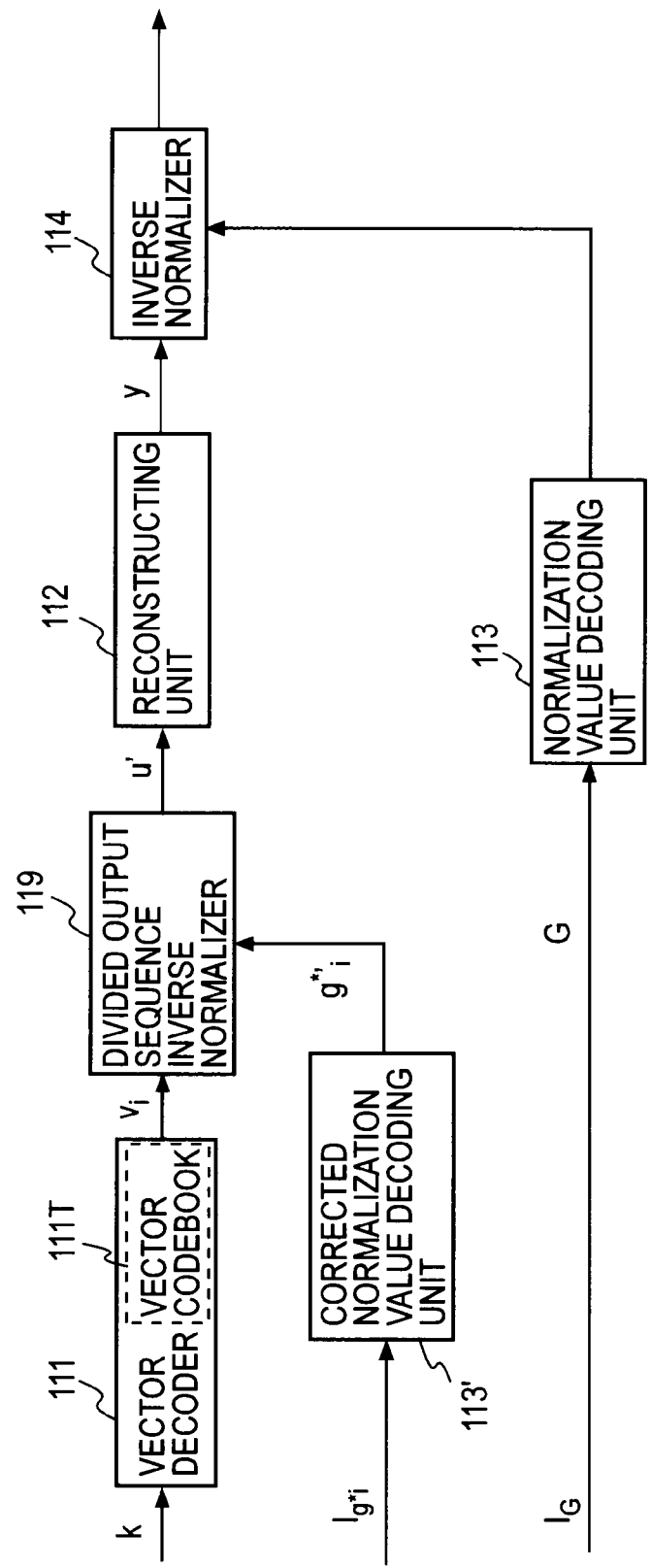
FIG. 22 shows a functional structure of a decoding apparatus corresponding to the coding apparatus shown in FIG. 21.

FIG. 22 shows a functional structure of a decoding apparatus corresponding to the coding apparatus shown in FIG. 21. The structure differs from the structure of the decoding apparatus shown in FIG. 28 in the following points: a divided output sequence inverse normalizer 119 is provided between the vector decoder 111 and the reconstructing unit 112; and a corrected normalization value decoding unit 113' is added. The corrected normalization value decoding unit 113' decodes the input corrected normalization value quantization index $I_{g*i}$ and outputs a decoded corrected normalization value $g*_i'$. The divided output sequence inverse normalizer 119 multiplies the divided output signal sequence $v_i$ by the decoded corrected normalization value $g*_i'$ and gives the result to the reconstructing unit 112. The rest of the operation is the same as in FIG. 28.

Fourteenth Embodiment

Figure 23:
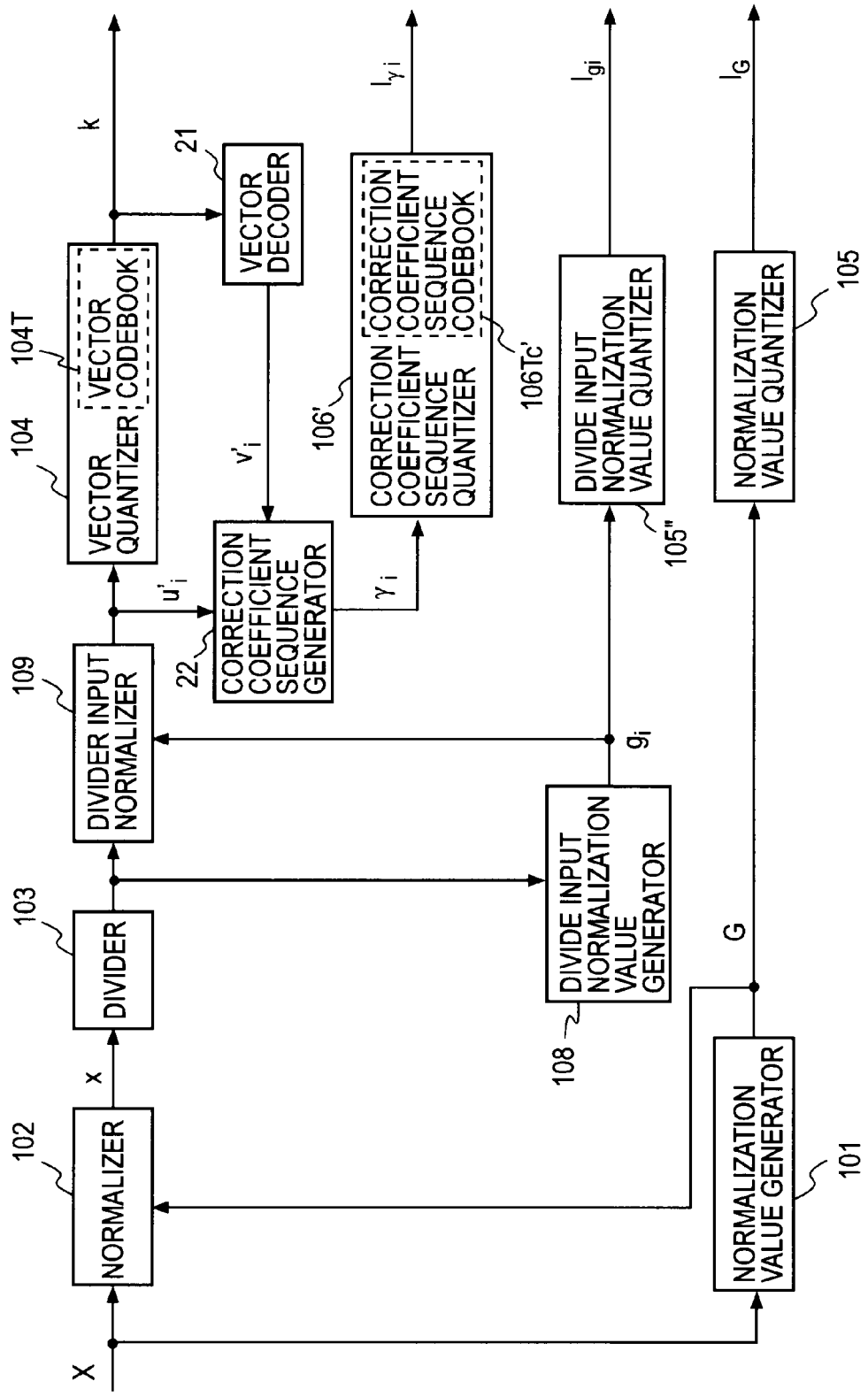
FIG. 23 shows an example of a functional structure of a coding apparatus according to a fourteenth embodiment of the present invention.

FIG. 23 shows a functional structure of a coding apparatus of a fourteenth embodiment. This embodiment differs from the embodiment shown in FIG. 21 in the following points: the divided input normalization value $g_i$ is not corrected; a sequence of divided input normalization values $g_i$ and a sequence of correction coefficients $\gamma_i$ are quantized separately, and their indexes are output. Accordingly, a divided input normalization value quantizer 105" and a correction coefficient sequence quantizer 106' are provided instead of the normalization value corrector 23' and the corrected normalization value quantizer 105' in FIG. 21. The divided input normalization value quantizer 105" quantizes the divided input normalization value $g_i$ and outputs its quantization index $I_{gi}$. The correction coefficient sequence quantizer 106' has a correction coefficient sequence codebook 106Tc' which holds a plurality of correction coefficient representative vectors in association with correction coefficient quantization indexes, and quantizes the sequence of correction coefficients $\gamma_i$ with reference to the codebook 106Tc', and outputs the corresponding index $I_{\gamma i}$. The rest of the operation is the same as in FIG. 21.

Figure 24:
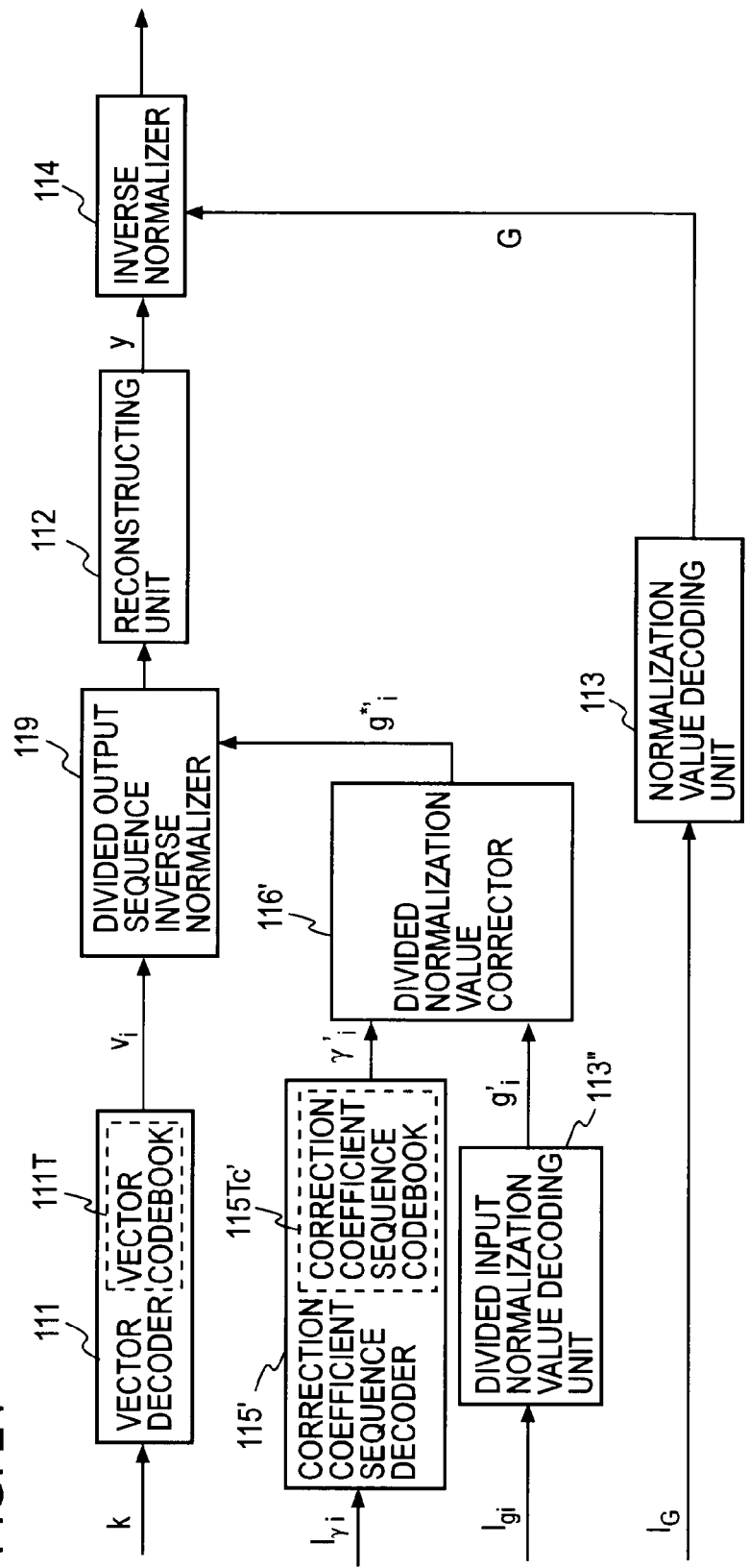
FIG. 24 shows a functional structure of a decoding apparatus corresponding to the coding apparatus shown in FIG. 23.

FIG. 24 shows a functional structure of a decoding apparatus corresponding to the coding apparatus shown in FIG. 23. The structure differs from the structure shown in FIG. 22 in that a divided input normalization value decoding unit 113", a correction coefficient sequence decoder 115', and a divided normalization value corrector 116' are provided instead of the corrected normalization value decoding unit 113'. The divided input normalization value decoding unit 113" decodes an input index $I_g$, and outputs a decoded divided input normalization value $g_i'$. The correction coefficient sequence decoder 115' has a correction coefficient sequence codebook 115Tc', which is the same as the correction coefficient sequence codebook 106Tc' of the coding apparatus, and decodes the input index $I_{\gamma i}$ with reference to the codebook 115Tc' and outputs a sequence of decoded correction coefficients $\gamma_i'$. The divided normalization value corrector 116' multiplies the decoded divided input normalization values $g_i'$ by the sequence of decoded correction coefficients $\gamma'_i$ and outputs corrected divided input normalization values $g*_i'$ to the divided output sequence inverse normalizer 119. The rest of the operation is the same as in FIG. 22.

As indicated by the embodiments described above, the normalization value is corrected by the coding apparatus or decoding apparatus according to the present invention. Accordingly, in a system in which the normalization value is corrected by a coding apparatus, the coding apparatus is structured to quantize the corrected normalization value by a normalization value quantizer. In a system in which the normalization value is corrected by a decoding apparatus, the coding apparatus is structured to quantize the normalization value by a normalization value quantizer or by a normalization value quantizer and a divided input normalization value quantizer and to quantize the correction coefficient by a correction coefficient quantizer or a correction coefficient sequence quantizer. The normalization value quantizer, divided input normalization value quantizer, correction coefficient quantizer, and correction coefficient sequence quantizer can be collectively called a normalization information quantizer, and the normalization value, divided input normalization value, and correction coefficient can be called normalization information.

Result of Simulation

Figure 25:
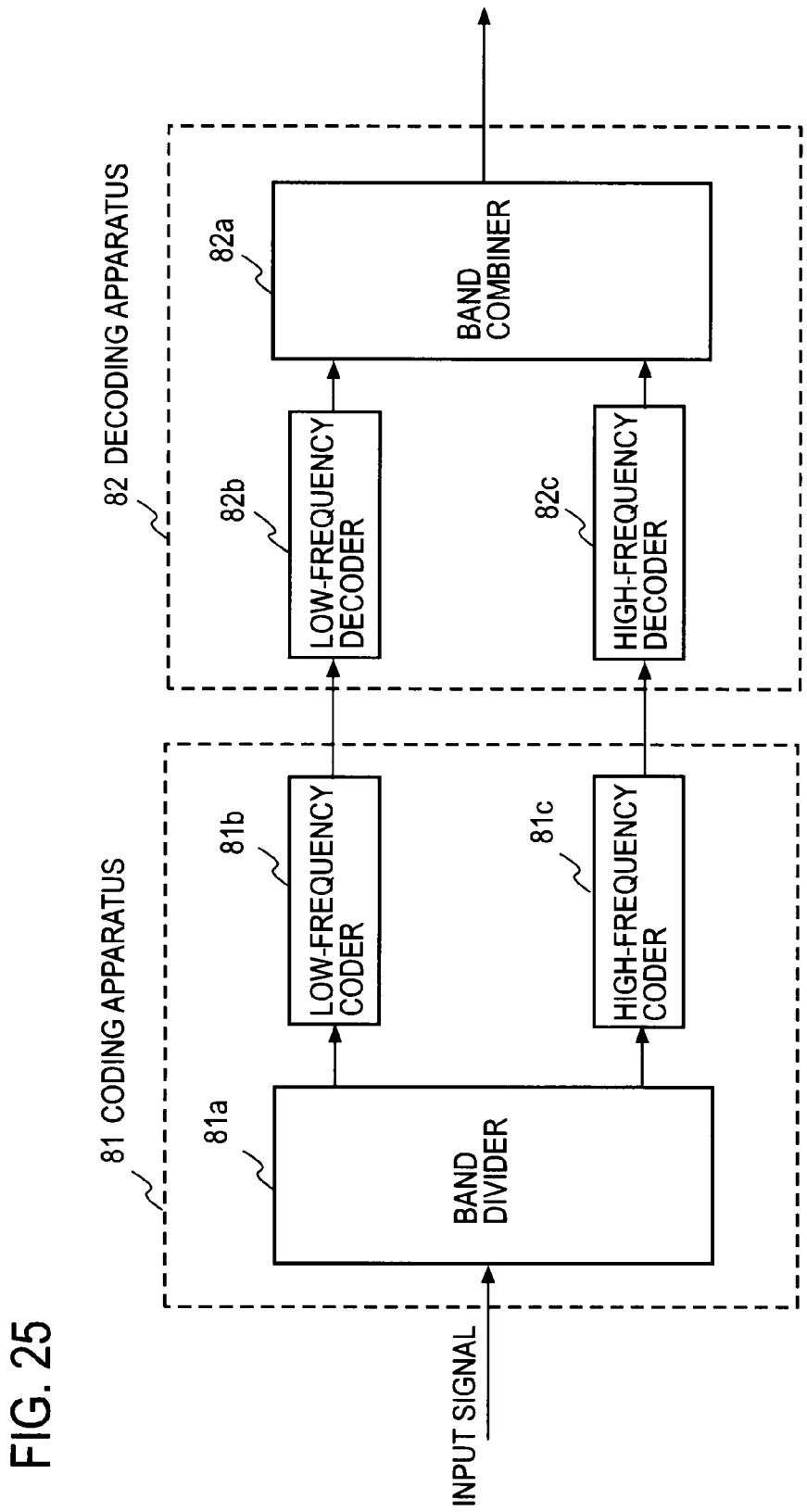
FIG. 25 shows a general functional structure of an experimental apparatus used for simulation.

The SNR obtained by the coding method according to the present invention was evaluated. FIG. 25 shows a general structure of an experimental apparatus 80 used in simulation. The experimental apparatus 80 includes a coding apparatus 81 and a decoding apparatus 82.

The coding apparatus 81 has a band divider 81a divide an input signal into a low-frequency signal and a high-frequency signal, and then codes the low-frequency signal in the time domain (by a low-frequency coder 81b) and codes the high-frequency signal in the frequency domain (by a high-frequency coder 81c). The coding method according to the present invention shown in FIG. 1 is applied to the high-frequency coder 81c. The decoding apparatus 82 decodes the low-frequency code and the high-frequency code using the conventional method shown in FIG. 28, and then combines the bands and outputs the result.

Figure 26:
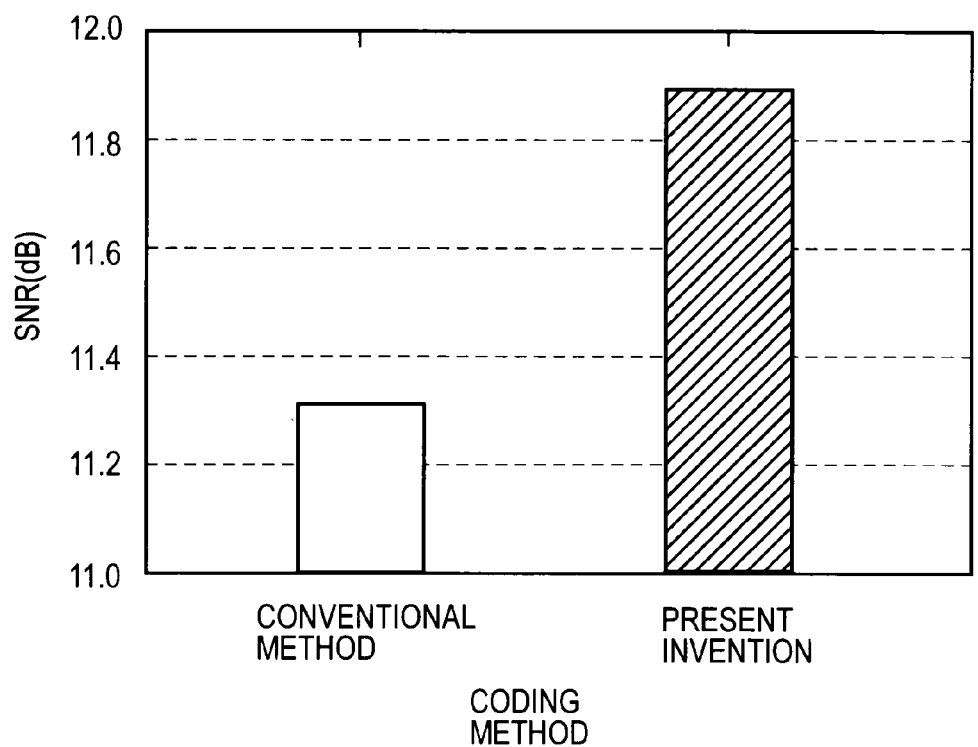
FIG. 26 shows simulation results.

The experimental apparatus 80 is given discrete values obtained by sampling a 57-second speech signal at 16 kHz, and the SNR after decoding is compared with the SNR obtained by the conventional method. The comparison is shown in FIG. 26. The vertical axis represents the SNR in dB, and the horizontal axis represents the coding method. It was confirmed that the SNR obtained by the coding method according to the present invention was 11.9 dB, which was 0.6 dB higher than 11.3 dB obtained by the conventional method.

The band was divided into two parts because of the experiment. However, when the coding method of the present invention is applied, there is no need to limit the band. In the examples described above, the coding apparatus of the present invention operates in the frequency domain, but it is not a necessary condition. The coding method and coding apparatus of the present invention can be applied to signal coding in the time domain as well. In that case, the divider 103 is formed of a filter bank or the like, but the technological concept of the present invention can be applied in the same way.

Neither a method nor an apparatus according to the present invention is limited to the above-described embodiments. Any modification can be made within the scope of the present invention. The processing explained in the above-described methods and apparatuses may be executed time sequentially in the order in which it is described or may be executed in parallel or separately in accordance with the processing capability of the apparatus that executes the processing or as necessary.

The processing of each component of the coding apparatus and the decoding apparatus of each of the above-described embodiments may be performed by a special processor such as a digital signal processor (DSP). If the processing of each component of the above-described apparatuses is implemented by a computer, the processing of the function to be provided by each apparatus is described in a program. By executing the program on the computer, the processing is implemented on the computer.

The program describing the processing can be recorded on a computer-readable recording medium. The computer-readable recording medium can be any type of magnetic recording device, optical disc, magneto-optical recording medium, or semiconductor memory, for example. More specifically, a hard disk drive, a flexible disk, a magnetic tape, or the like can be used as the magnetic recording device; a digital versatile disc (DVD), a digital versatile disc random access memory (DVD-RAM), a compact disc read only memory (CD-ROM), a recordable compact disc (CD-R), a rewritable compact disc (CD-RW), or the like can be used as the optical disc; a magneto-optical disc (MO) or the like can be used as a magneto-optical recording medium; and an electronically erasable and programmable read only memory (EEP-ROM) or the like can be used as the semiconductor memory, for example.

The program may be distributed by selling, transferring, or lending a portable recording medium, such as a DVD or a CD-ROM, with the program recorded on it, for example. The program may also be distributed by storing the program in a storage device of a server computer and sending the program from the server computer through a network to another computer.

The processing may be implemented by executing the predetermined program on the computer. Alternatively, at least a part of the processing may be implemented by hardware.

What is claimed is:

1. A coding method, implemented by a coding apparatus, comprising:
    a normalization step of normalizing, by a normalizer of the coding apparatus, an input signal in each frame containing a plurality of samples, with a normalization value corresponding to the input signal and calculated from the input signal in the frame to generate a normalized input signal sequence;
    a signal quantization step of quantizing, by a signal quantizer of the coding apparatus, the normalized input signal sequence to generate and output a signal quantization index;
    a correction coefficient generation step of generating, by a correction coefficient generator of the coding apparatus, a correction coefficient that minimizes a distance measure between an input signal sequence and a signal sequence obtained by inverse normalizing a signal sequence corresponding to the signal quantization index with the normalization value corrected with the correction coefficient; and
    a normalization information quantization step of generating and outputting, by a normalization information quantizer of the coding apparatus, a normalization information quantization index by quantizing the correction coefficient and the normalization value or the normalization value corrected with the correction coefficient.

2. The coding method according to claim 1, further comprising a decoding step of generating, by a decoder of the coding apparatus, the signal sequence corresponding to the signal quantization index as a normalized output signal sequence;
    wherein the correction coefficient is generated by dividing a first correction coefficient by a second correction coefficient in the correction coefficient generation step, the first correction coefficient being an inner product of the normalized input signal sequence and the normalized output signal sequence, and the second correction coefficient being a total sum of squares of the vector of the normalized output signal sequence.

3. The coding method according to claim 1, further comprising:
    a decoding step of generating, by a decoder of the coding apparatus, the signal sequence corresponding to the signal quantization index as a normalized output signal sequence; and
    a correction calculation step of generating, by a correction calculator of the coding apparatus, the corrected normalization value by multiplying the normalization value by a first correction coefficient and dividing the result of multiplying by a second correction coefficient;
    wherein the correction coefficient generation step comprises:
    a first correction coefficient generation process of generating, by a first correction coefficient generator of the coding apparatus, an inner product of the normalized input signal sequence and the normalized output signal sequence as the first correction coefficient; and
    a second correction coefficient generation process of generating, by a second correction coefficient generator of the coding apparatus, a total sum of squares of the vector of the normalized output signal sequence as the second correction coefficient.

4. The coding method according to claim 1, wherein the correction coefficient generation step comprises a process of generating a first correction coefficient $\beta_1$ which is an inner product of the normalized input signal sequence and the normalized output signal sequence and a second correction coefficient $\beta_2$ which is a total sum of squares of a vector of the normalized output signal sequence as the correction coefficient; and
    the normalization information quantization step comprises a correction coefficient quantization process of searching, by a correction coefficient quantizer of the coding apparatus, a correction coefficient codebook holding a plurality of predetermined representative correction coefficients in association with correction coefficient quantization indexes, for a correction coefficient quantization index corresponding to a quantized correction coefficient $\gamma'$ that minimizes the distance measure d" given by $$d''=-2\gamma'\beta_1+\gamma'^2\beta_2$$

and outputting the correction coefficient quantization index.

5. The coding method according to claim 1, wherein the signal quantization step comprises a process of searching a vector codebook holding a plurality of predetermined representative vectors in association with vector quantization indexes, for a representative vector that minimizes the distance measure obtained by using an inner product of the normalized input signal sequence and the representative vector in the vector codebook and a total sum of squares of the representative vector in the vector codebook; and
    in the correction coefficient generation step, the correction coefficient is generated by dividing the inner product used when the distance measure is minimized in the signal quantization step by the total sum of squares.

6. The coding method according to claim 1, further comprising a correction calculation step of generating, by a correction calculator of the coding apparatus, the corrected normalization value by multiplying the normalization value by a first correction coefficient and dividing the result of multiplying by a second correction coefficient, wherein the signal quantization step comprises a process of searching a vector codebook holding a plurality of predetermined representative vectors in association with vector quantization indexes, for a representative vector that minimizes the distance measure obtained by using an inner product of the normalized input signal sequence and the representative vector in the vector codebook and a total sum of squares of the representative vector in the vector codebook, and in the correction coefficient generation step, the inner product used when the distance measure is minimized in the signal quantization step is obtained as the first correction coefficient and the total sum of squares is obtained as the second correction coefficient.

7. The coding method according to claim 1, wherein the signal quantization step comprises a process of searching a vector codebook holding a plurality of predetermined representative vectors in association with vector quantization indexes, for a representative vector that minimizes the distance measure obtained by using an inner product of the normalized input signal sequence and the representative vector in the vector codebook and a total sum of squares of the representative vector in the vector codebook;

in the correction coefficient generation step, the correction coefficient is obtained as a group formed of a first coefficient $\beta_1$, which is the inner product used when the distance measure is minimized in the signal quantization step, and a second coefficient $\beta_2$, which is the total sum of squares; and the normalization information quantization step comprises a correction coefficient quantization process of searching, by a correction coefficient quantizer of the coding apparatus, a correction coefficient codebook holding a plurality of predetermined quantized correction coefficients in association with correction coefficient quantization indexes, for a correction coefficient quantization index corresponding to a quantized correction coefficient $\gamma'$ that minimizes the distance measure d″ given by $$d''=-2\gamma'\beta_1+\gamma'^2\beta_2$$

and outputting the correction coefficient quantization index.

8. The coding method according to any one of claims 1 to 7, further comprising a dividing step of generating, by a divider of the coding apparatus, divided input signal sequences by dividing the normalized input signal sequence in accordance with a predetermined rule in each frame, wherein the generated divided input signal sequences are each used as the normalized input signal sequence in the signal quantization step and subsequent steps.

9. A coding method implemented by a coding apparatus, comprising:

a normalization step of normalizing, by a normalizer of the coding apparatus, an input signal in each frame containing a plurality of samples, with a normalization value corresponding to the input signal and calculated from the input signal in the frame to generate a normalized input signal sequence;

a dividing step of generating, by a divider of the coding apparatus, divided input signal sequences by dividing the normalized input signal sequence in accordance with a predetermined rule in each frame;

a vector quantization step of performing, by a vector quantizer of the coding apparatus, vector quantization of the respective divided input signal sequences to generate and output vector quantization indexes;

a decoding step of generating, by a decoder of the coding apparatus, a signal sequence corresponding to each vector quantization index as a divided output signal sequence;

a correction coefficient generation step of generating, by a correction coefficient generator of the coding apparatus, a correction coefficient by dividing a first correction coefficient by a second correction coefficient, the first correction coefficient being a total sum of inner products of the divided input signal sequences and the divided output signal sequences and the second correction coefficient being a total sum of the sums of squares of the vectors of the divided output signal sequences; and a normalization information quantization step of generating and outputting, by a normalization information quantizer of the coding apparatus, a normalization information quantization index by quantizing the correction coefficient and the normalization value or the normalization value corrected with the correction coefficient.

10. A coding apparatus comprising:

a normalizer, implemented by a hardware processor, configured to normalize an input signal in each frame containing a plurality of samples, with a normalization value corresponding to the input signal and calculated from the input signal in the frame to generate a normalized input signal sequence;

a signal quantizer configured to quantize the normalized input signal sequence to generate and output a signal quantization index;

a correction coefficient generator configured to generate a correction coefficient that minimizes a distance measure between an input signal sequence and a signal sequence obtained by inverse normalizing a signal sequence corresponding to the signal quantization index with the normalization value corrected with the correction coefficient; and a normalization information quantizer configured to generate and output a normalization information quantization index by quantizing the correction coefficient and the normalization value or the normalization value corrected with the correction coefficient.

11. The coding apparatus according to claim 10, further comprising a decoder configured to generate the signal sequence corresponding to the signal quantization index as a normalized output signal sequence, wherein the correction coefficient generator is configured to generate the correction coefficient by dividing a first correction coefficient by a second correction coefficient, the first correction coefficient being an inner product of the normalized input signal sequence and the normalized output signal sequence and the second correction coefficient being a total sum of squares of the vector of the normalized output signal sequence.

12. The coding apparatus according to claim 10, further comprising:

a decoder configured to generate the signal sequence corresponding to the signal quantization index as a normalized output signal sequence; and wherein the correction coefficient generator comprises:

a first correction coefficient generator configured to generate an inner product of the normalized input signal sequence and the normalized output signal sequence as the first correction coefficient;

a second correction coefficient generator configured to generate a total sum of squares of the vector of the normalized output signal sequence as the second correction coefficient; and a correction calculator configured to generate the corrected normalization value by multiplying the normalization value by said first correction coefficient and dividing the result of multiplying by said second correction coefficient.

13. The coding apparatus according to claim 10, wherein the correction coefficient generator generates a first correction coefficient $\beta_1$ which is an inner product of the normalized input signal sequence and a normalized output signal sequence, and a second correction coefficient $\beta_2$ which is a total sum of squares of the vectors of the normalized output signal sequence as the correction coefficient; and the normalization information quantizer comprises a correction coefficient quantizer configured to search a correction coefficient codebook holding a plurality of predetermined representative correction coefficients in association with correction coefficient quantization indexes, for a correction coefficient quantization index corresponding to a quantized correction coefficient $\gamma'$ that minimizes the distance measure d" given by $$d''=-2\gamma'\beta_1+\gamma'^2\beta_2$$

and to output the correction coefficient quantization index.

14. The coding apparatus according to claim 10, wherein the signal quantizer is configured to search a vector codebook holding a plurality of predetermined representative vectors in association with vector quantization indexes, for a representative vector that minimizes the distance measure obtained by using an inner product of the normalized input signal sequence and the representative vector in the vector codebook and a total sum of squares of the representative vector in the vector codebook; and the correction coefficient generator is configured to generate the correction coefficient by dividing the inner product used when the distance measure is minimized in the signal quantizer by the total sum of squares.

15. The coding apparatus according to claim 10, further comprising a correction calculator configured to generate the corrected normalization value by multiplying the normalization value by a first correction coefficient and dividing the result of multiplying by a second correction coefficient, wherein the signal quantizer is configured to search a vector codebook holding a plurality of predetermined representative vectors in association with vector quantization indexes, for a representative vector that minimizes the distance measure obtained by using an inner product of the normalized input signal sequence and the representative vector in the vector codebook and a total sum of squares of the representative vector in the vector codebook, and the correction coefficient generator is configured to obtain the inner product used when the distance measure is minimized in the signal quantizer as the first correction coefficient and the total sum of squares as the second correction coefficient.

16. The coding apparatus according to claim 10, wherein the signal quantizer is configured to search a vector codebook holding a plurality of predetermined representative vectors in association with vector quantization indexes, for a representative vector that minimizes the distance measure obtained by using an inner product of the normalized input signal sequence and the representative vector in the vector codebook and a total sum of squares of the representative vector in the vector codebook;

the correction coefficient generator is configured to obtain the correction coefficient as a group formed of a first coefficient $\beta_1$, which is the inner product used when the distance measure is minimized in the signal quantizer, and a second coefficient $\beta_2$, which is the total sum of squares; and the normalization information quantizer comprises a correction coefficient quantizer configured to search a correction coefficient codebook holding a plurality of predetermined quantized correction coefficients in association with correction coefficient quantization indexes, for a correction coefficient quantization index corresponding to a quantized correction coefficient $\gamma'$ that minimizes the distance measure d" given by $$d''=-2\gamma'\beta_1+\gamma'^2\beta_2$$

and to output the correction coefficient quantization index.

17. The coding apparatus according to any one of claims 10 to 16, further comprising a divider configured to generate divided input signal sequences by dividing the normalized input signal sequence in accordance with a predetermined rule in each frame and to output each of the generated divided input signal sequences as the normalized input signal sequence.

18. A coding apparatus comprising:
a normalizer, implemented by a hardware processor, configured to normalize an input signal in each frame containing a plurality of samples, with a normalization value corresponding to the input signal and calculated from the input signal in the frame to generate a normalized input signal sequence;
a divider configured to generate divided input signal sequences by dividing the normalized input signal sequence in accordance with a predetermined rule in each frame;
a vector quantizer configured to perform vector quantization of the respective divided input signal sequences to generate and output vector quantization indexes;
a decoder configured to generate a signal sequence corresponding to each vector quantization index as a divided output signal sequence;
a correction coefficient generator configured to generate a correction coefficient by dividing a first correction coefficient by a second correction coefficient, the first correction coefficient being a total sum of inner products of the divided input signal sequences and the divided output signal sequences and the second correction coefficient being a total sum of the sums of squares of the vectors of the divided output signal sequences; and
a normalization information quantizer configured to generate and output a normalization information quantization index by quantizing the correction coefficient and the normalization value or the normalization value corrected with the correction coefficient.

19. A decoding method, implemented by a decoding apparatus, comprising:
a normalization value decoding process of decoding, by a normalization value decoding unit of the decoding apparatus, an input normalization value quantization index to generate a normalization value of each frame;
a vector decoding process of decoding, by a vector decoder of the decoding apparatus, an input signal quantization index to generate a normalized output signal sequence of each frame;
a correction coefficient decoding process of decoding, by a correction coefficient decoder of the decoding apparatus, an input correction coefficient quantization index to generate a correction coefficient of each frame;

a normalization value correction process of correcting, by a normalization value corrector of the decoding apparatus, the normalization value with the correction coefficient to generate a corrected normalization value; and an inverse normalization process of inverse normalizing, by an inverse normalizer of the decoding apparatus, the normalized output signal sequence with the corrected normalization value to generate an output signal of each frame.

20. The decoding method according to claim 19, further comprising a reconstructing process of arranging, by a reconstructing unit of the decoding apparatus, samples in a plurality of divided output signal sequences in accordance with a predetermined rule to generate the normalized output signal sequence, wherein, in the vector decoding process, the input signal quantization index is decoded to generate the plurality of divided output signal sequences in each frame.

21. A decoding apparatus comprising:

a normalization value decoder, implemented by a hardware processor, configured to decode an input normalization value quantization index to generate a normalization value of each frame;

a vector decoder configured to decode an input signal quantization index to generate a normalized output signal sequence of each frame;

a correction coefficient decoder configured to decode an input correction coefficient quantization index to generate a correction coefficient of each frame;

a normalization value corrector configured to correct the normalization value with the correction coefficient to generate a corrected normalization value; and an inverse normalizer configured to inverse-normalize the normalized output signal sequence with the corrected normalization value to generate an output signal of each frame.

22. The decoding apparatus according to claim 21, further comprising a reconstructing unit configured to arrange an output signal sequence to generate the normalized output signal sequence in accordance with a predetermined rule.

23. A non-transitory computer-readable recording medium having recoded thereon a program for implementing the method according to any one of claims 1, 9 and 19.

* * * * *